(12) United States Patent
Kojima

(10) Patent No.: US 7,222,926 B2
(45) Date of Patent: May 29, 2007

(54) DROPLET JETTING APPARATUS, AN ELECTRO-OPTICAL APPARATUS, A METHOD OF MANUFACTURING AN ELECTRO-OPTICAL APPARATUS, AND AN ELECTRONIC DEVICE

(75) Inventor: Kenji Kojima, Suwa (JP)

(73) Assignee: Seiko Epson Corporation (JP)

( * ) Notice: Subject to any disclaimer, the term of this patent is extended or adjusted under 35 U.S.C. 154(b) by 119 days.

(21) Appl. No.: 10/781,345

(22) Filed: Feb. 18, 2004

(65) Prior Publication Data

US 2004/0263544 A1 Dec. 30, 2004

(30) Foreign Application Priority Data

Feb. 19, 2003 (JP) ............................. 2003-041759

(51) Int. Cl.
*B41J 25/308* (2006.01)
(52) U.S. Cl. ................ 347/8; 347/5; 347/9; 347/104
(58) Field of Classification Search .................. 347/5, 347/8
See application file for complete search history.

(56) References Cited

U.S. PATENT DOCUMENTS 5,444,468 A * 8/1995 Fukushima et al. .......... 347/14
5,831,646 A * 11/1998 Kuronuma et al. .......... 347/30

FOREIGN PATENT DOCUMENTS

JP 10-260307 9/1998

* cited by examiner

*Primary Examiner*—Stephen Meier
*Assistant Examiner*—Brian J. Goldberg
(74) *Attorney, Agent, or Firm*—Harness, Dickey & Pierce, P.L.C.

(57) ABSTRACT

A droplet jetting apparatus of the present invention includes: a head unit having droplet jetting heads; a head unit support 61 for supporting the head unit; an X-axis direction moving mechanism 6 for moving the head unit support 61; and a head driving control section 130 for controlling driving of the droplet jetting heads. The head driving control section 130 is provided on the head unit support 61 so that the head driving control section 130 is moved with respect to the main body together with the head unit. Thus, it is possible to provide a droplet jetting apparatus capable of suppressing generation of noise in drawing pattern data transmission, and carrying out accurate driving of the droplet jetting heads; an electro-optical apparatus manufactured using such droplet jetting apparatus; a method of manufacturing an electro-optical apparatus using such droplet jetting apparatus; and an electronic device comprising such electro-optical apparatus.

3 Claims, 14 Drawing Sheets

DROPLET JETTING APPARATUS, AN ELECTRO-OPTICAL APPARATUS, A METHOD OF MANUFACTURING AN ELECTRO-OPTICAL APPARATUS, AND AN ELECTRONIC DEVICE

TECHNICAL FIELD

The present invention is related to a droplet jetting apparatus, an electro-optical apparatus, a method of manufacturing an electro-optical apparatus, and an electronic device.

BACKGROUND ART

An industrial droplet jetting apparatus (ink jet drawing apparatus) has been proposed for use in manufacturing an organic EL (electroluminescence) display device or a color filter in a liquid crystal display device or the like, or forming metal wires on a substrate, for example, by applying an ink jet method (droplet jetting method) of an ink jet printer.

In this droplet jetting apparatus, a head unit which includes droplet jetting heads (ink jet heads) is provided so as to be movable with respect to a main body (see, for example, Japanese Laid-Open Patent Publication No. HEI 10-260307). Further, a pattern is drawn on a work by jetting droplets from the droplet jelling heads while moving the work placing portion and the head unit relatively to each other based on drawing pattern data which has been converted to a bit map. The drawing pattern data is normally created by an external apparatus such as a personal computer or the like, and during the drawing operation, a head driving control section controls the driving of each droplet jetting head based on this drawing pattern data.

In this prior art droplet jetting apparatus, the head driving control section is provided outside the main body, and the head driving control section and the droplet jetting heads are connected via electric cables such as FFC (Flexible Flat Cable) or the like, for example. In this case, the electric cables connecting the head driving control section and the droplet jetting heads are housed in a cableveyor (that is a conveyor for protection of cables therein) to make it possible for the electric cable to follow the movement of the head unit, but the length thereof is very long. For this reason, in the process of transmitting the drawing pattern data from the head driving control section to the droplet jetting heads, cross talk noise or the like, for example, is generated, and there are cases where such noise has adverse effects on the drawing accuracy.

DISCLOSURE OF INVENTION

It is therefore an object of the present invention to provide a droplet jetting apparatus which makes it possible to suppress the generation of noise in the drawing pattern data transmission, and carry out accurate driving of the droplet jetting heads. It is another object of the present invention to provide an electro-optical apparatus which is manufactured using such droplet jetting apparatus, a method of manufacturing an electro-optical apparatus using such a droplet jetting apparatus, and an electronic device equipped with such am electro-optical apparatus.

In order to achieve the above-mentioned object, in one aspect of the present invention, the present invention is directed to a droplet jetting apparatus. The droplet jetting apparatus comprises:

a main body;

a work placing on which a work is to be placed;

a head unit having at least one droplet jetting head for jetting droplets of a liquid to be used onto the work;

a head unit support for supporting the head unit;

a head unit moving mechanism for moving the head unit support in a horizontal direction with respect to the main body;

a head driving control section for controlling driving of the at least one droplet jetting head;

a control unit for controlling the head driving control section, the control unit storing drawing pattern data including a plurality of patterns;

first transmission means which connects the control unit to the head driving control section for transmitting the drawing pattern data from the control unit to the head driving control section; and second transmission means which connects the head driving control section to the at least one droplet jetting head for transmitting the drawing pattern data from the head driving control section to the at least one droplet jetting head;

wherein the droplet jetting apparatus is constructed so as to form a predetermined pattern in the plurality of patterns onto the work by jetting droplets to the work from the at least one droplet jetting head while moving the work placing portion and the head unit relatively to each other;

characterized in that the head driving control section is provided on the head unit support so that the head driving control section is moved in a horizontal direction with respect to the main body by the head unit moving mechanism.

This makes it possible to suppress the generation of noise in the process of transmitting drawing pattern data, whereby it is possible to draw patterns at high accuracy.

It is preferable that the droplet jetting apparatus further comprises a Y-axis direction moving mechanism for moving the work placing portion in one horizontal direction with respect to the main body (hereinafter, the one horizontal direction is referred to as "Y-axis direction") wherein the head unit moving mechanism moves the head unit support in another horizontal direction which is perpendicular to the Y-axis direction (hereinafter, this direction is referred to as "X-axis direction").

This makes it possible for the droplet jetting apparatus to have a structure to obtain high accuracy of position in the relative movement of the head unit and the work placing portion. As a result, it is possible to draw patterns at higher accuracy.

It is preferable that one of the X-axis and Y-axis directions is defined as a main scan direction and the other is defined as a sub scan direction, and wherein the droplet jetting apparatus is constructed so as to form the predetermined pattern onto the work by moving the work placing portion and the head unit relatively.

This makes it possible to form (draw) a variety of patterns on the work in accordance with any purpose.

In another aspect of the present invention, the present invention is directed to an electro-optical apparatus. The electro-optical apparatus is manufactured using the droplet jetting apparatus as mentioned above.

This makes it possible to provide an electro-optical apparatus equipped with a high-performance component on which a pattern is formed (drawn) at high accuracy, and manufactured at a low cost.

In yet another aspect of the present invention, the present invention is directed to a method of manufacturing an electro-optical apparatus using the droplet jetting apparatus as mentioned above.

This makes it possible to provide a method of manufacturing an electro-optical apparatus by which it is possible to form (draw) a pattern on a work at high accuracy and manufacture it at a low cost.

In still another aspect of the present invention, the present invention is directed to an electronic device comprising the electro-optical apparatus as mentioned above.

This makes it possible to provide an electronic device equipped with a high-performance component on which a pattern is formed (drawn) at high accuracy, and manufactured at a low cost.

BRIEF DESCRIPTION OF DRAWINGS

The above and other objects, features, and the advantages of the invention will readily become more apparent from the following detailed description of preferred embodiments of the invention with reference to the accompanying drawings.

BEST MODE FOR CARRYING OUT THE INVENTION

Hereinafter, the preferred embodiments of a droplet jetting apparatus according to the present invention will be described in detail with reference to the drawings.

Figure 1:
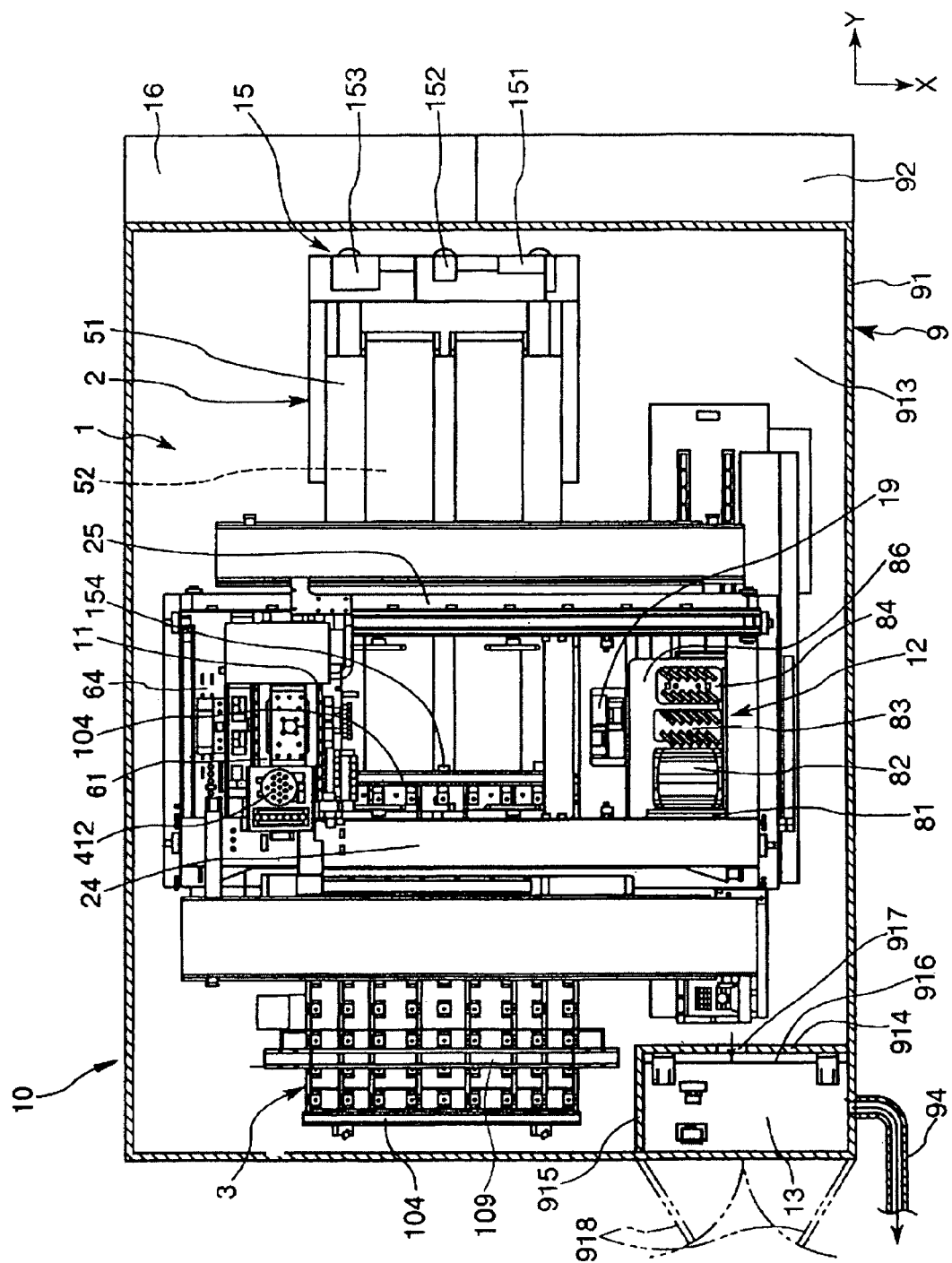
FIG. 1 shows a plan view of a droplet jetting apparatus in an embodiment according to the present invention.
Figure 2:
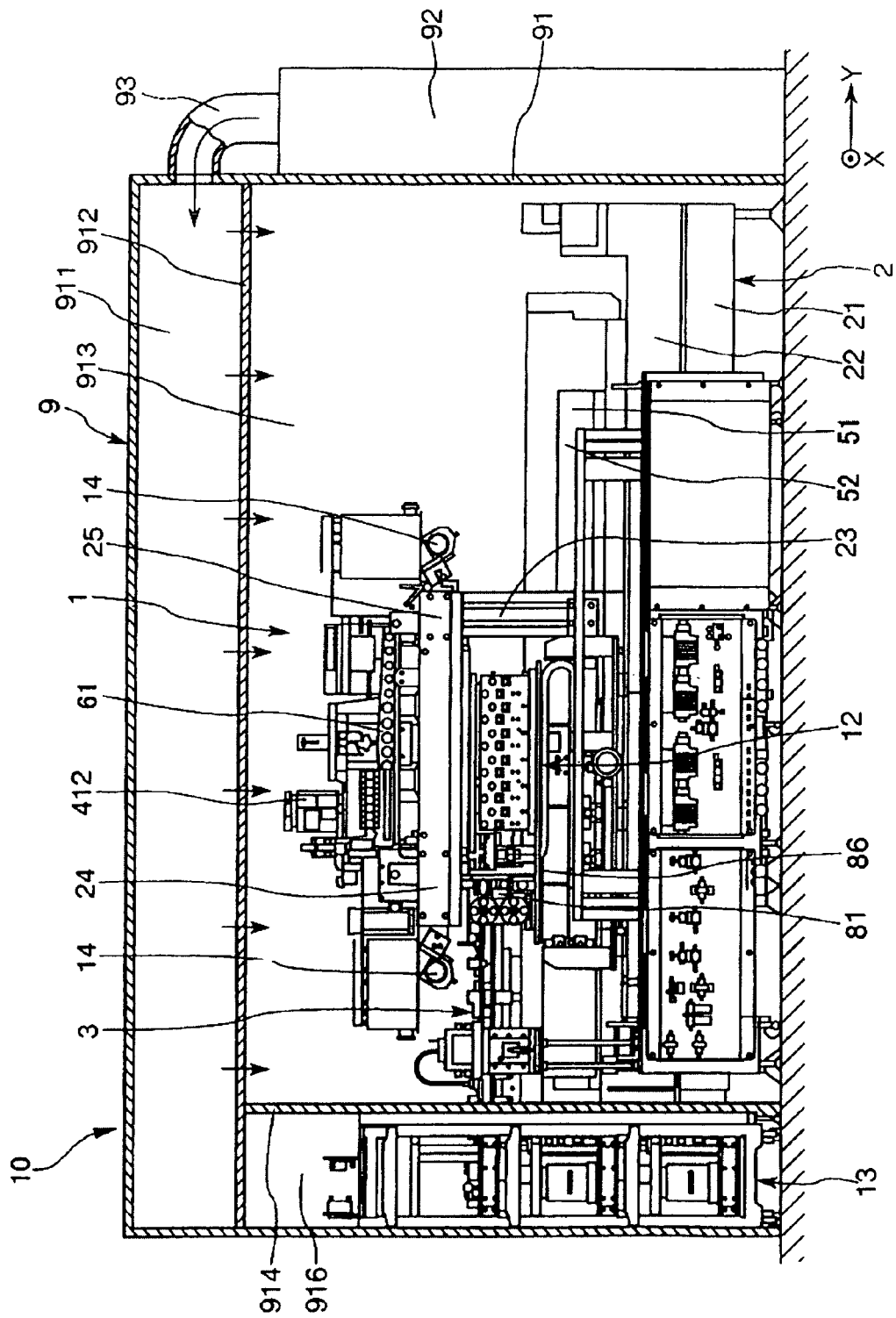
FIG. 2 shows a side view of a droplet jetting apparatus in an embodiment according to the present invention.

FIGS. 1 and 2 respectively show a plan view and a side view of a droplet jetting apparatus in one embodiment according to the present invention. Now, for the sake of convenience in the description below, one horizontal direction (i.e., the direction corresponding to the left and right direction in FIGS. 1 and 2) is referred to as the "Y-axis direction," and another horizontal direction perpendicular to this Y-axis direction (i.e., the direction corresponding to the up and down direction in FIG. 1) is referred to as the "X-axis direction." Further, movement along the Y-axis in the right direction in FIGS. 1 and 2 is referred to as "forward movement on the Y-axis," movement along the Y-axis in the left direction in FIGS. 1 and 2 is referred to as "backward movement on the Y-axis," movement along the X-axis in the down direction in FIG. 1 is referred to as "forward movement on the X-axis," movement along the X-axis in the up direction in FIG. 1 is referred to as "backward movement on the X-axis."

A droplet jetting system 10 shown in FIGS. 1 and 2 is equipped with a droplet jetting apparatus (ink jet drawing apparatus) 1 according to the present invention, and a chamber (chamber room) 91 which houses the droplet jetting apparatus 1.

The droplet jetting apparatus 1 is an apparatus in which a liquid (jetting object liquid, i.e., liquid to be jetted) such as ink, a functional liquid which contains a specified (intended) material, or the like, for example, is jetted in a state of minute liquid drops onto a substrate W used as a work by an ink jet method (droplet jetting method), and the jetted droplets are bonded (attached) to the substrate to form (draw) a predetermined pattern thereon. This apparatus can be used in manufacturing an organic EL display device, a color filter in a liquid crystal display device or the like, or forming metal wires on a substrate, for example. The raw material of the substrate W which the droplet jetting apparatus 1 is tended to deal with is not particularly limited, and any plate-shaped member can be used, such as a glass substrate, a silicon substrate, a flexible substrate or the like, for example.

Further, the work that forms the object in the present invention is not limited to a plate-shaped member, and any member having a flat base may be used. For example, in the case where a lens forms the work, the present invention can be applied to a droplet jetting apparatus or the like which forms a coating such as an optical thin film or the like by jetting droplets onto the lens. Moreover, the present invention can be applied preferably to a relatively large size droplet jetting apparatus 1 which makes it possible to deal with relatively large size works (for example, works having lengths and widths that are about several dozen cm to several m).

The droplet jetting apparatus 1 comprises: a main body 2; a substrate conveying table (substrate conveying stage) 3 which serves as a work placing portion; a Y-axis direction moving mechanism 5 for moving the substrate conveying table 3 in the Y-axis direction with respect to the main body 2; a θ-axis rotating mechanism 105 for rotating the substrate conveying table 3; a head unit 11 which includes a plurality of droplet jetting heads (ink jet heads) 111; an alignment camera 17; a drawing confirmation camera 18; and an X-axis direction moving mechanism 6 for moving the head unit 11, the alignment camera 17 and the drawing confirmation camera 18 in the X-axis direction with respect to the main body 2.

Figure 12:
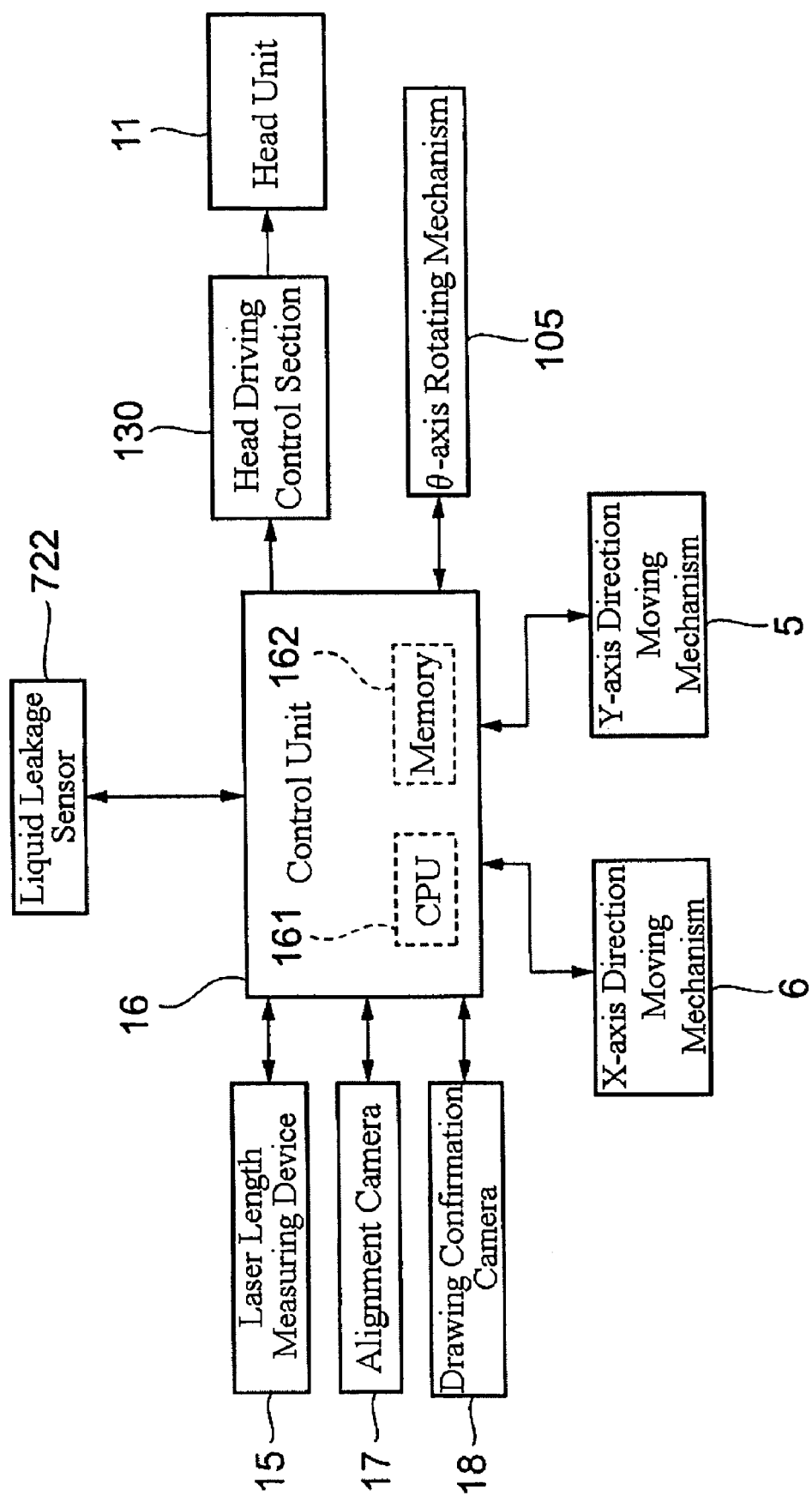
FIG. 12 is a block diagram of the droplet jetting apparatus shown in FIGS. 1 and 2.

Further, the droplet jetting apparatus 1 further comprises a control unit (control means) 16 for controlling the operations of each section of the droplet jetting apparatus 1. FIG. 12 is a block diagram of the droplet jetting apparatus 1 shown in FIGS. 1 and 2. As shown in FIG. 12, the control unit 16 includes a CPU (Central Processing Unit) 161, and a memory 162 in which various programs and various data of programs and the like for carrying out control operations of the droplet jetting apparatus 1 are stored.

The Y-axis direction moving mechanism 5, the X-axis direction moving mechanism 6 and the θ-axis rotating mechanism 105 are respectively connected to the control unit 16 via drive circuits (drivers) (not shown in the drawings). Further, each droplet jetting head 111 of the head unit 11 is connected to the control unit 16 via a head driving control section 130. Moreover, a liquid leak sensor 722, a laser length measuring device 15, the alignment camera 17 and the drawing confirmation camera 18 (which are described later) are connected to the control unit 16. In addition, each section of the droplet jetting apparatus 1 is electrically connected to the control unit 16, but this is omitted in FIG. 12. The control unit 16 is preferably provided outside the chamber 91 (see FIG. 1).

The control unit 16 creates (generates) drawing pattern data that has been converted to bit-map formatted data (i.e., a bit map), and stores this data in the memory 162. Further, the control unit 16 transmits this drawing pattern data to the head driving control section 130. In this regard, drawing pattern data may be created by a separate external apparatus to be recorded on a recording medium via which the drawing pattern data is then read in the control unit 16.

In the droplet jetting apparatus 1 of the present invention, the liquid jetted from the droplet jetting heads 111 is not particularly limited. In addition to ink which includes a filter material of a color filter, it is possible to use various liquids which include various materials (including dispersion liquids such as suspensions, emulsions and the like). Examples of liquids include light-emitting materials for forming an EL light-emitting layer in an organic EL (electroluminescence) apparatus; fluorescent materials for forming a fluorescent body on an electrode in an electron emission apparatus; fluorescent materials for forming a fluorescent body in a PDP (Plasma Display Panel) apparatus; migrating body materials for forming migrating bodies in an electric migration display device; bank materials for forming a bank on the surface of a substrate W; various coating materials; liquid electrode materials for forming electrodes; particulate materials for constructing a spacer for forming a very small cell gap between two substrates; liquid metal materials for forming metal wires; lens materials for forming microlenses; resist materials; and light-diffusing materials for forming a light diffusion body.

As shown in FIG. 2, the main body 2 includes a trestle 21 provided on the floor, and a stone machine platen (fixed platen) 22 provided on the trestle 21. The substrate conveying table 3 is provided on the stone machine platen 22 so as to be movable in the Y-axis direction with respect to the main body 2. The substrate conveying table 3 is moved forward and backward by means of driving of a linear motor 51. A substrate W is placed on the substrate conveying table 3.

In the droplet jetting apparatus 1, it is possible to deal with the substrate W that have various shapes and sizes from a relatively large size substrate W having substantially the same size as the substrate conveying table 3 to a relatively small size substrate W which is smaller than the substrate conveying table 3. Preferably, a droplet jetting operation is carried out in the state where the substrate W is positioned so that the center thereof is aligned with the center of the substrate conveying table 3 in principle. However, in the case of a relatively small size substrate W, the droplet jetting operation may be carried out with the substrate W positioned at a position near the edge of the substrate conveying table 3.

As shown in FIG. 1, pre-drawing flushing units 104 for receiving droplets that have been discarded by jetting (referred to as preliminary jetting, flushing, or trial shot) from the droplet jetting heads 111 before droplet jetting (drawing) onto the substrate W are respectively provided near two sides of the substrate conveying table 3 along the X-axis direction. A suction tube (not shown in the drawings) is connected to the pre-drawing flushing units 104, and the jetting object liquid that is discarded by jetting is collected inside a waste liquid tank provided in a tank placing portion 13 through the suction tube.

The moving distance of the substrate conveying table 3 in the Y-axis direction is measured by a laser length measuring device 15 which serves as moving distance detecting means. The laser length measuring device 15 includes a laser length measuring device sensor head 151 provided at the side of the main body 2, a mirror 152, a laser length measuring device body 153, and a corner cube 154 provided at the side of the substrate conveying table 3. Laser light emitted from the laser length measuring device sensor head 151 along the X-axis direction is refracted by the mirror 152 and propagates along the Y-axis direction, and then emitted onto the corner cube 154. The light reflected by the corner cube 154 passes through the mirror 152 and returns to the laser length measuring device sensor head 151. In the droplet jetting apparatus 1, the timing of the jetting from the droplet jetting heads 111 is created based on the moving distance (or current position) of the substrate conveying table 3 detected by this kind of laser length measuring device 15.

In the main body 2, a head unit support 61 that supports the head unit 11 is provided in the upper space of the substrate conveying table 3 so as to be moveable in the X-axis direction. The head unit 11 which includes the plurality of droplet jetting heads 111 is moved forward and backward in the X-axis direction together with the head unit support 61 by means of the driving of a linear motor actuator 62 provided in an X-axis direction moving mechanism 6 (described later).

Further, a blowing apparatus (blower) 14 that partially dries the droplets jetted on the substrate W is provided in the main body 2. The blowing apparatus 14 includes a nozzle having a slit-shaped opening which slits align in the X-axis direction. While the substrate W is being conveyed in the Y-axis direction by the substrate conveying table 3, a gas is blown out from this nozzle toward the substrate W. In the droplet jetting apparatus 1 of the present embodiment, two blowing apparatuses 14 are provided at separate positions with respect to the Y-axis direction.

A missing dot detection unit 19 is fixedly provided at a place that does not lie within the moving range of the substrate conveying table 3 on the stone machine platen 22 and is below the moving range of the head unit 11. The missing dot detection unit 19 detects missing dots caused by clogging of the openings of the nozzles of the droplet jetting heads 111. The missing dot detection unit 19 is equipped with a light-emitting portion for emitting light and a light-receiving portion for receiving the emitted light, for example.

When carrying out such missing dot detection, the head unit 11 jets droplets from each nozzle while moving in the X-axis direction through the space above the missing dot detection unit 19, and the missing dot detection unit 19 carries out light emission and light reception on the jetted droplets, whereby the presence or absence of a clogged nozzle and the location thereof are detected optically. At this time, the jetting object liquid jetted from the droplet jetting heads 111 accumulates in a pan provided in the missing dot detection unit 19, and then after passing through a suction tube (not shown in the drawings) connected to the bottom of this pan, the discarded liquid is collected and stored inside the waste liquid tank provided in the tank placing portion 13.

The tank placing portion 13 holds a jetting object liquid tank (primary tank) which stores the jetting object liquid supplied to the droplet jetting heads 111, a cleaning liquid tank, a recycling tank and the waste liquid tank (none of which are shown in the drawings). The cleaning liquid tank stores a cleaning liquid that is supplied to a cleaning unit 81 (described later). The recycling tank stores the jetting object liquid collected from a capping unit 83 (described later). The waste liquid tank stores the jetting object liquid collected from each of the pre-drawing flushing unit 104, the missing dot detection unit 19 and a periodic flushing unit 82 (described later).

Further, the inside of the jetting object liquid tank and the inside of the cleaning liquid tank are pressurized by a pressurized gas such as nitrogen gas or the like, for example, supplied from a pressurized gas supplying source (not shown in the drawings) provided near the droplet jetting apparatus 1 (preferably, outside a chamber 91 described later), and the jetting object liquid and the cleaning liquid are delivered by means of this pressure.

Moreover, as shown in FIG. 1, an ionizing unit (ionizer) 109 is provided so as to straddle the moving range of the substrate conveying table 3. The ionizing unit 109 removes the electric charge of the substrate W.

This kind of droplet jetting apparatus 1 preferably carries out droplet jetting (drawing) on the substrate W under an environment where the temperature and humidity of the atmosphere therein are controlled by a chamber apparatus 9. The chamber apparatus 9 includes a chamber 91 that houses the droplet jetting apparatus 1, and an air conditioner 92 that is provided outside the chamber 91. The air conditioner 92 is internally provided with a known air conditioner apparatus which controls (adjusts) the temperature and humidity of the air, and this controlled air is supplied to the ceiling back side 911 of the chamber 91 via an introduction duct 93. The air supplied to the ceiling back side 911 from the air conditioner 92 passes through a filter 912 provided in the ceiling, and is introduced into a main chamber 913 of the chamber 91.

In addition to the main chamber 913, a sub-chamber 916 formed by partition walls 914, 915 is provided inside the chamber 91. The tank placing portion 13 is provided inside the sub-chamber 916. A communicating portion (opening) 917 that communicates the main chamber 913 and the sub-chamber 916 is formed in the partition wall 914.

The sub-chamber 916 is provided with open/close doors (open/close portion) 918 that open and close to the outside of the chamber 91 (see FIG. 1). In this regard, the open/close portion of the sub-chamber 916 is not limited to hinged doors like the open/close doors 918, and it may be a sliding door, a shutter or the like.

Further, an exhaust port for discharging the gases inside the sub-chamber 916 is formed in the sub-chamber 916, and an exhaust duct 94 that extends to the outside is connected to this exhaust port. The air inside the main chamber 913 passes through the communicating portion 917 and flows into the sub-chamber 916, and then this air passes through the exhaust duct 94 and is discharged to the outside of the chamber apparatus 9.

By controlling the temperature and humidity of the environment of the droplet jetting apparatus 1 by means of this kind of chamber apparatus 9, it is possible to prevent the creation of errors caused by expansion or contraction of the substrate W and each portion of the apparatus 1 due to temperature changes, and this makes it possible to further improve the accuracy of patterns drawn (formed) on the substrate W. Further, because the tank placing portion 13 is also placed in an environment in which the temperature and humidity are controlled, the properties of the jetting object liquid such as viscosity and the like are also stabilized, and this makes it possible to form (draw) patterns at higher accuracy. Moreover, it is possible to prevent dirt, dust and the like from entering into the inside of the chamber 91, and this makes it possible to keep the substrate W clean.

In this regard, the inside of the chamber 91 may be supplied and filled with a gas other than air (for example, an inert gas such as nitrogen, carbon dioxide, helium, neon, argon, krypton, xenon, radon or the like) that has undergone air-conditioning, and the droplet jetting apparatus 1 may be operated in an atmosphere of this type of gas.

Further, in this kind of droplet jetting system 10, opening the open/close doors 918 makes it possible to access the tank placing portion 13 without opening the main chamber 913 to the outside. Thus, because the controlled temperature and humidity of the surroundings (environment) of the droplet jetting apparatus 1 are not disturbed when the tank placing portion 13 is accessed, it is possible to form (draw) patterns at high accuracy even immediately after carrying out tank replacement, or refilling or collecting of a liquid. Moreover, because operations can be started without having to wait for the temperature inside the main chamber 913 and the temperature of each portion of the droplet jetting apparatus 1 to return to the controlled temperature even after carrying out tank replacement, or refilling or collecting of a liquid, the throughput (production efficiency) can be improved. For this reasons, such system is extremely advantageous in mass-producing works such as the substrate W at high accuracy, and it is possible to reduce manufacturing costs.

Figure 3:
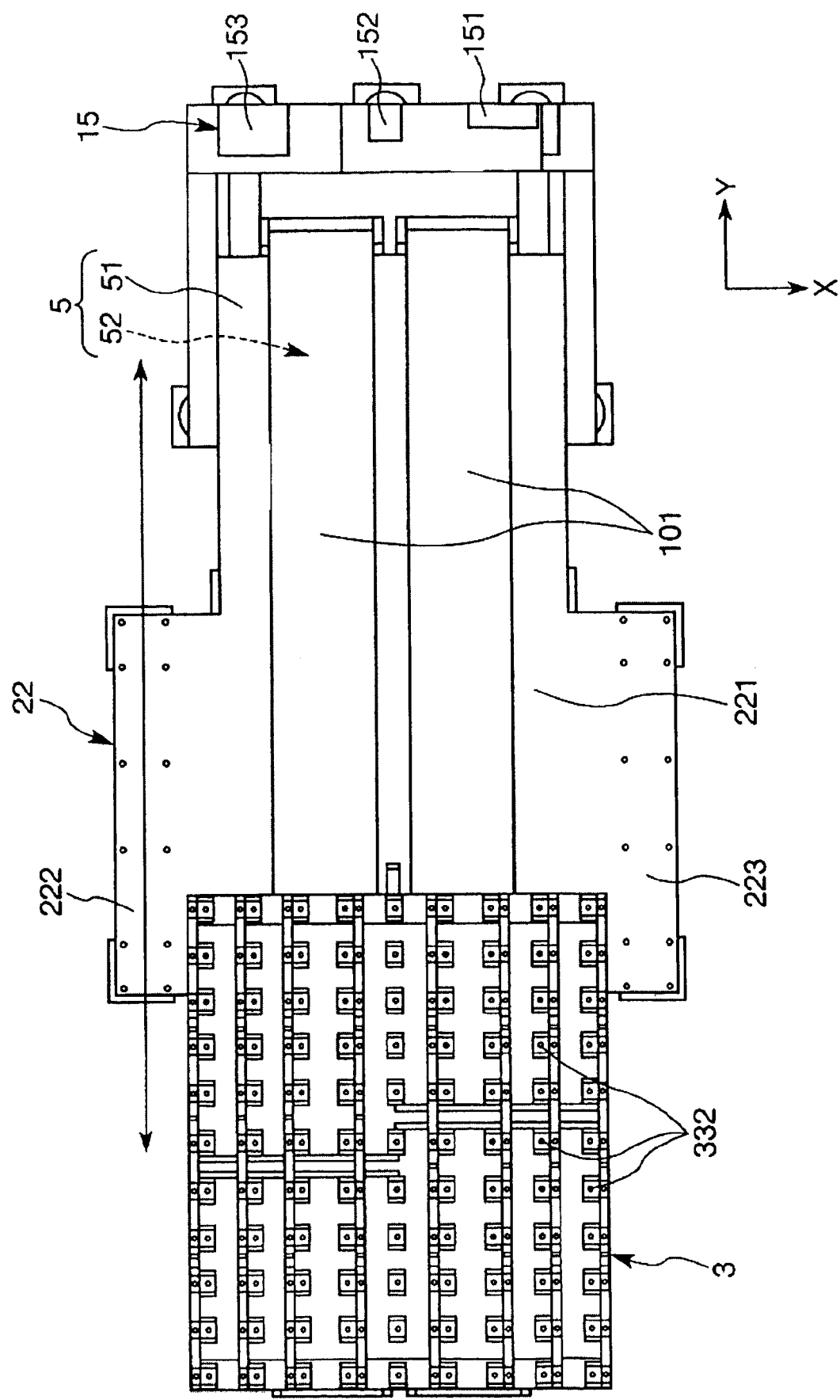
FIG. 3 is a plan view showing the trestle, the stone machine platen and the substrate conveying table in the droplet jetting apparatus shown in FIGS. 1 and 2.
Figure 4:
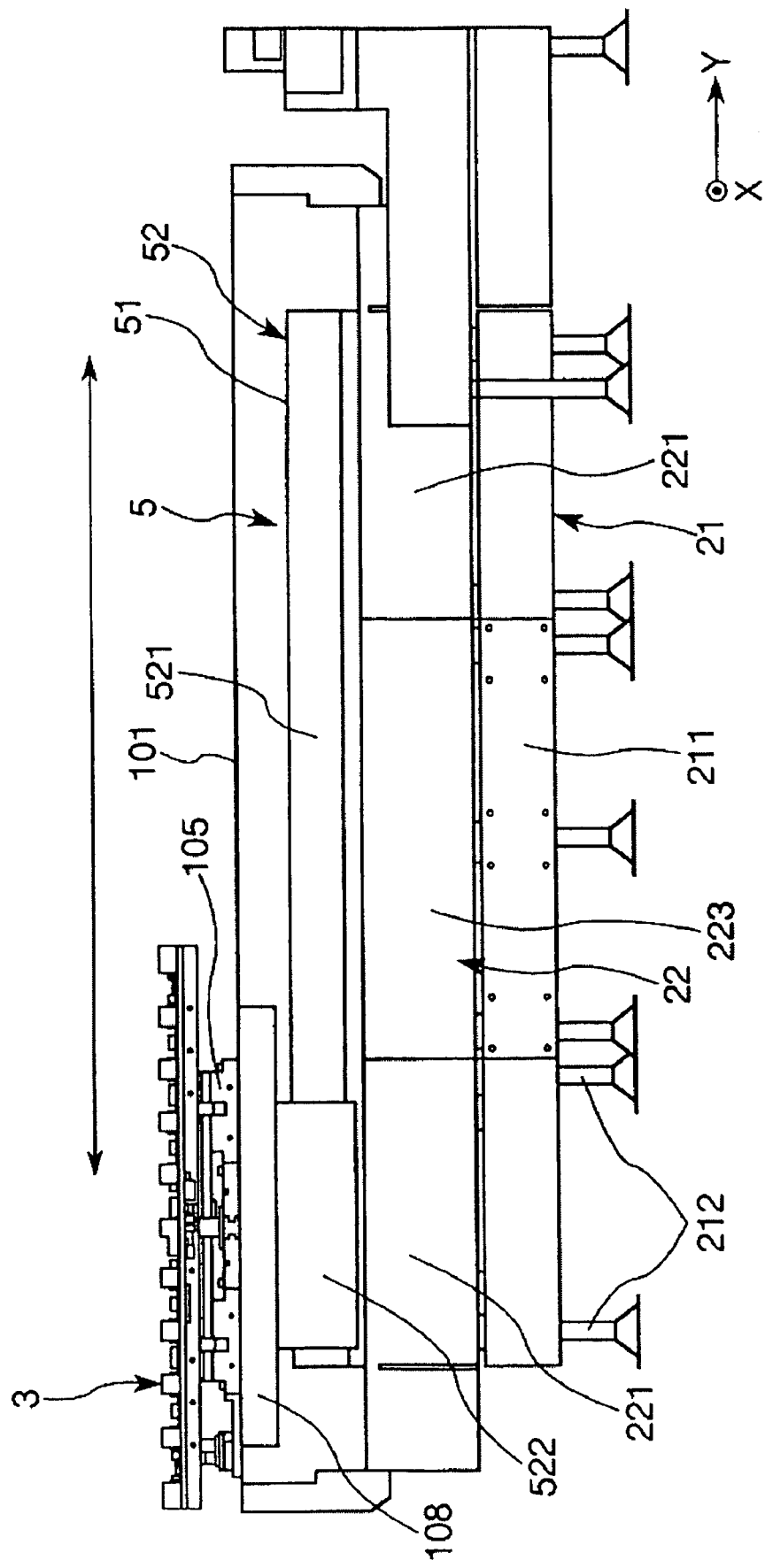
FIG. 4 is a side view showing the trestle, the stone machine platen and the substrate conveying table in the droplet jetting apparatus shown in FIGS. 1 and 2.

FIG. 3 is a plan view showing the trestle, the stone machine platen and the substrate conveying table in the droplet jetting apparatus shown in FIGS. 1 and 2. FIG. 4 is a side view showing the trestle, the stone machine platen and the substrate conveying table in the droplet jetting apparatus shown in FIGS. 1 and 2.

As shown in FIGS. 3 and 4, the substrate conveying table 3 and the Y-axis direction moving mechanism 5 for moving the substrate conveying table 3 in the Y-axis direction are provided on the stone machine platen 22. As shown in FIG. 3, a plurality of suction holes (suction portions) 332 that create suction to hold the loaded substrate W in place are formed in the substrate conveying table 3.

As shown in FIG. 4, the Y-axis direction moving mechanism 5 includes a linear motor 51 and an air slider 52. The air slider 52 includes a slide guide 521 which extends along the Y-axis direction on top of the stone machine platen 22, and a slide block 522 which moves along the slide guide 521. The slide block 522 includes blow holes which blow air between the slide block 522 and the slide guide 521. By providing the air blown from the blow holes between the slide block 522 and the slide guide 521, the slide block 522 can be moved smoothly along the slide guide 521.

A base 108 is fixed to the top of the slide block 522, and the substrate conveying table 3 is fixed to the top of the base 108 via a θ-axis rotating mechanism 105. In this way, the substrate conveying table 3 is supported by the air slider 52 so as to be smoothly movable in the Y-axis direction, and the substrate conveying table 3 is moved in the Y-axis direction by the driving of the linear motor 51.

The θ-axis rotating mechanism 105 includes a bearing that supports the substrate conveying table 3 in a way that makes it possible to rotate the substrate conveying table 3 in a predetermined range around a perpendicular axis (θ-axis) forming a center of rotation which passes through the center of the substrate conveying table 3, and an actuator which rotates the substrate conveying table 3, and is operated based on the control of the control unit 16.

A pair of strip-shaped thin plates 101 made from a metal material such as stainless steel or the like, for example, are spread above the Y-axis direction moving mechanism 5 so as to cover the Y-axis direction moving mechanism 5 from the upper side thereof. The thin plates 101 are passed through the inside of concave portions (grooves) formed in the top of the base 108 and inserted between the base 108 and the θ-axis rotating mechanism 105. By providing these thin plates 101, it is possible to prevent the jetting object liquid that is jetted from the droplet jetting heads 111 from sticking to the Y-axis direction moving mechanism 5, and this makes it possible to protect the Y-axis direction moving mechanism 5.

The stone machine platen 22 is made from a pure stone, and the top surface thereof has a high degree of flatness. The stone machine platen 22 is superior in various characteristics such as stability against environmental temperature changes, vibration damping, stability against changes (deterioration) due to aging, corrosion resistance against the jetting object liquid and the like. In the present embodiment, by supporting the Y-axis direction moving mechanism 5 and the X-axis direction moving mechanism 6 (described later) by means of this kind of stone machine platen 22, there are few errors due to the effects of environmental temperature changes, vibration, changes (deterioration) due to aging and the like. Therefore, it is possible to obtain high accuracy in the relative movement of the substrate conveying table 3 and the head unit 11 (droplet jetting heads 111), and it is possible to normally stabilize and maintain this high accuracy. As a result, the forming (drawing) of patterns can be carried out at higher accuracy in a normally stabilized manner.

The stone that forms the stone machine platen 22 is not particularly limited, but Belfast Black, Rustenburg, Kurnool or Indian Black is preferred as the stone. In this way, each of the characteristics of the stone machine platen 22 described above can be further improved.

This kind of stone machine platen 22 is supported on the trestle 21. The trestle 21 includes a frame member 211 constructed by assembling angled materials and the like into a square, and a plurality of support legs 212 which are arranged in a dispersed manner on the bottom of the frame member 211. The trestle 21 preferably includes a vibration-proof (anti-vibration) structure constituted from an air spring or a rubber bushing or the like, and is constructed so that vibration from the floor is prevented from being transmitted as much as possible to the stone machine platen 22.

Further, the stone machine platen 22 is preferably supported (held) on the trestle 21 in a non-fastened state (non-fixed state) with the trestle 21. In this way, it is possible to prevent thermal expansion and the like occurring in the trestle 21 from having an effect on the stone machine platen 22, and as a result, the forming (drawing) of patterns can be carried out at higher accuracy.

Moreover, in the present embodiment, the stone machine platen 22 is constructed from a Y-axis direction moving mechanism support 221 which forms a rectangle whose long side is parallel to the Y-axis direction when viewed from a top of the stone machine platen 22, and column supports 222 and 223 which respectively protrude on both sides in the X-axis direction from a middle portion of the Y-axis direction moving mechanism support 221 in the longitudinal direction. As a result, the shape of the stone machine platen 22 forms a cross shape when viewed from the top thereof. In other words, the stone machine platen 22 forms a shape in which the four corner portions are excluded from the rectangle when viewed from the top thereof. Four columns 23 (described later) are provided on top of the column supports 222 and 223. Namely, the stone machine platen 22 forms a shape in which the portions not provided with the Y-axis direction moving mechanism 5 and the columns 23 are excluded from the rectangle when viewed from the top thereof.

In this way, it is possible to reduce the weight of the stone machine platen 22. Further, because the area occupied by the stone machine platen 22 can be made small, it becomes easy to transport the stone machine platen 22 to the mounting location of the droplet jetting apparatus 1, and the withstand load of the floor of the mounting location in a factory can be made small. In addition, the area occupied by the droplet jetting system 10 inside the factor can be made small. In this regard, the stone machine platen 22 in this embodiment may be constructed from one stone, or it may be constructed from a plurality of stones assembled together.

Figure 5:
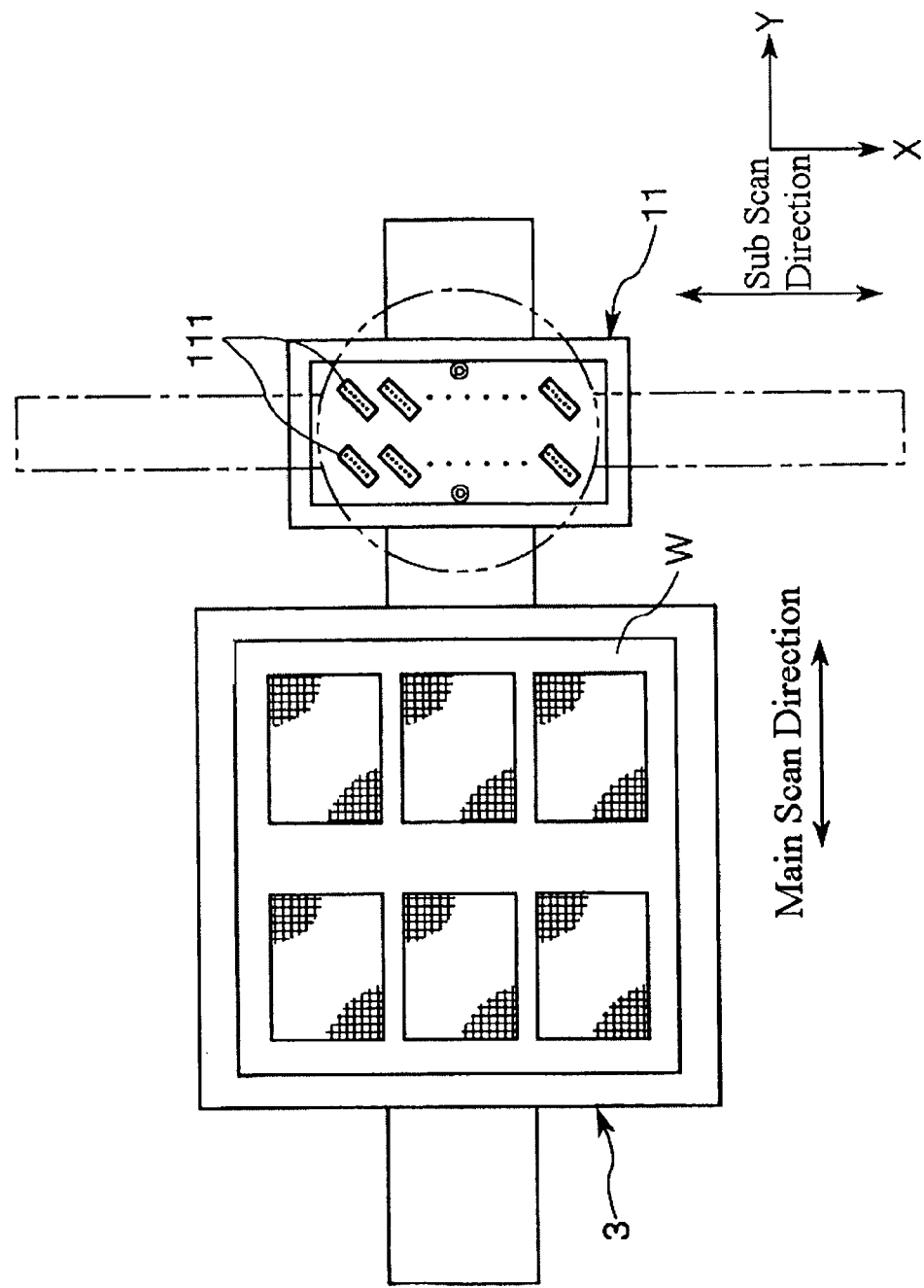
FIG. 5 is an explanatory drawing for describing the pattern forming operation (drawing operation) in the droplet jetting apparatus shown in FIGS. 1 and 2.

FIG. 5 is an explanatory drawing for describing the pattern forming operation (drawing operation) in the droplet jetting apparatus shown in FIGS. 1 and 2. As shown in FIG. 5, a plurality of droplet jetting heads 111 (twelve heads 111 in the present embodiment) are provided in the head unit 11. A large number of jetting nozzles (openings) which jet droplets are formed in one row or two or more rows in the nozzle forming surface of each droplet jetting head 111. In this embodiment, twelve droplet jetting heads 111 are arranged in two rows in each of which six heads 111 are aligned in the sub scan direction (X-axis direction) in the head unit 11, and each of the droplet jetting heads 111 is positioned so that the nozzle rows thereof are inclined with respect to the sub scan direction.

Drive sections which include piezoelectric elements (not shown in the drawings) that serve as driving elements for each jetting nozzle are provided in the droplet jetting heads 111. The control unit 16 controls the driving of each drive section for each droplet jetting head 111 of the head unit 11 via a head driving control section 130. In this way, each droplet jetting head 111 jets droplets from predetermined jetting nozzles. In this case, when a predetermined voltage is applied to a piezoelectric element, for example, such piezoelectric element will deform (expand and contract), and in accordance with this, a pressure chamber (liquid chamber) corresponding to the piezoelectric element is pressurized, whereby a predetermined amount of droplets are jetted from the corresponding jetting nozzle (i.e., the jetting nozzle that communicates with such pressure chamber).

In this regard, in the present invention, the droplet jetting heads 111 are not limited to the structure described above.

For example, the droplet jetting heads 111 may be constructed so that the jetting object liquid is heated and boiled by a heater serving as a driving element to create pressure by which droplets are jetted from the jetting heads.

Further, the arrangement pattern of each droplet jetting head 111 in the head unit 11 described above is just one example, and other arrangements may be used, such as an arrangement in which adjacent droplet jetting heads 111 in each head row have an angle of 90° (i.e., adjacent jetting heads 111 form an "L" shape), or an arrangement in which the droplet jetting heads 111 between each head row have an angle of 90° (i.e., the heads between rows form an "L" shape), for example. Either case may be used so long as the dots due to all the jetting nozzles of the plurality of droplet jetting heads 111 are continuous in the sub scan direction.

Moreover, the droplet jetting heads 111 do not have to be arranged in positions in which the heads 111 are inclined with respect to the sub scan direction, and the plurality of droplet jetting heads 111 may be arranged to have a zigzag shape or a stepwise shape. So long as it is possible to construct nozzle rows (dot rows) each having a predetermined length, the plurality of droplet jetting heads may be constructed by a single droplet jetting head 111. Further, a plurality of head units 11 may be provided on the head unit support 61.

After the alignment of the substrate W (described later) is completed, the droplet jetting apparatus 1 begins an operation to form (draw) predetermined patterns on the substrate W. This operation is carried out by performing a main scan and a sub scan on the droplet jetting heads 111 (head unit 11) with respect to the substrate W in a relative manner.

In the droplet jetting apparatus 1 of the present embodiment, with the head unit 11 in a stopped (non-moving) state with respect to the main body 2, the main scan is carried out by jetting droplets from each droplet jetting head 111 on the substrate W while the substrate W is moved in the Y-axis direction by the movement of the substrate conveying table 3. Namely, in the present embodiment, the Y-axis direction forms the main scan direction.

The main scan may be carried out during the forward movement (forth movement), the backward movement (back movement), or both the forward movement and the backward movement (round trip) of the substrate conveying table 3. Further, the substrate conveying table 3 may make a plurality of round trips to repeatedly carry out the main scan a plurality of times. By carrying out this kind of main scan, the jetting of droplets in a region that extends along the main scan direction with a predetermined width (i.e., the width in which droplets can be jetted by the head unit 11) on the substrate W is completed.

After carrying out this kind of main scan, the sub scan is carried out. The sub scan is carried out by moving the head unit 11 in the X-axis direction by only the predetermined width described above by means of the movement of the head unit support 61 when there is no jetting of droplets. Namely, in the present embodiment, the X-axis direction forms the sub scan direction.

After carrying out this kind of sub scan, a main scan same as that described above is carried out. Thus, droplets are jetted in a region adjacent to the region in which droplets were jetted in the previous main scan.

In this way, by repeatedly carrying out the main scan and the sub scan in an alternating manner, it is possible to jet droplets on the entire region of the substrate W, and this makes it possible to form (draw) predetermined patterns on the substrate W by means of the jetted droplets (liquid mass).

In this regard, in the present invention, the main scan direction and the sub scan direction may be the reverse of those described above. Namely, the droplet jetting apparatus may be constructed so that the main scan is carried out by jetting droplets on the substrate W while moving the droplet jetting heads 111 (head unit 11) in the X-axis direction with the substrate W (i.e., the substrate conveying table 3) in a stopped state, and the sub scan is carried out by moving the substrate W (i.e., the substrate conveying table 3) in the Y-axis direction when there is no jetting of droplets.

Figure 6:
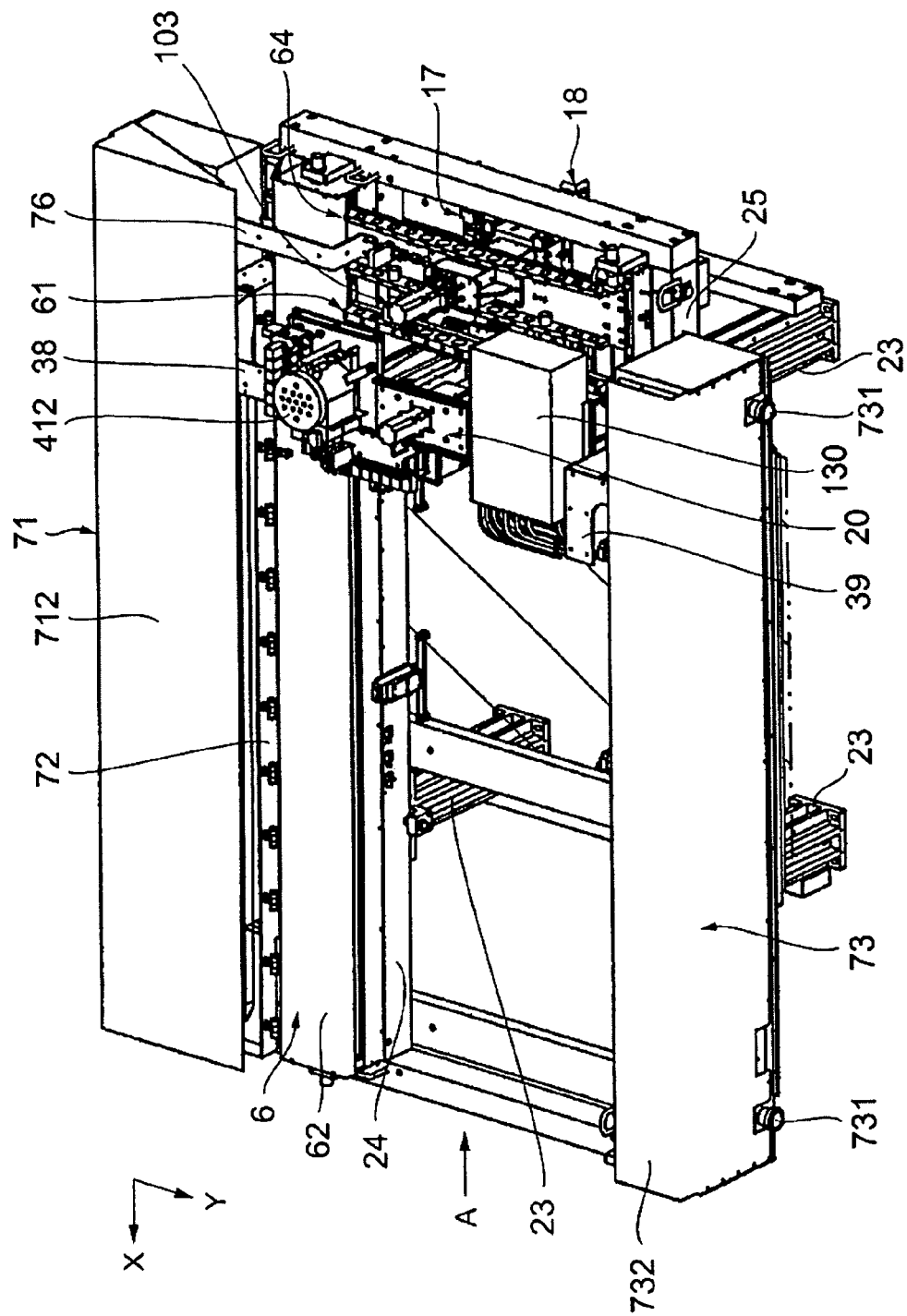
FIG. 6 is a perspective view showing the head unit support and the X-axis direction moving mechanism and the like in the droplet jetting apparatus shown in FIGS. 1 and 2.
Figure 7:
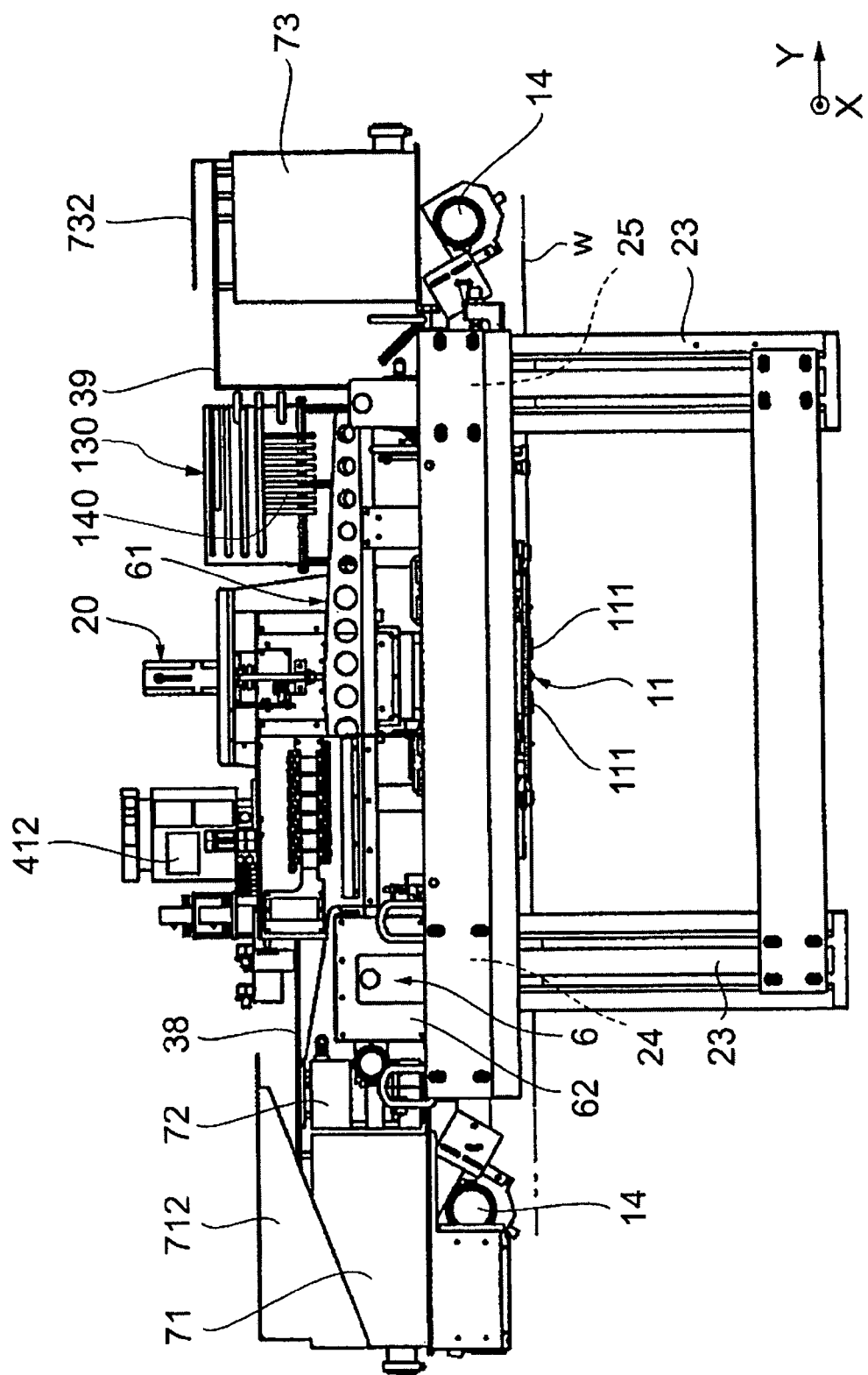
FIG. 7 is a side view when viewed from the direction of the arrow A in FIG. 6.
Figure 8:
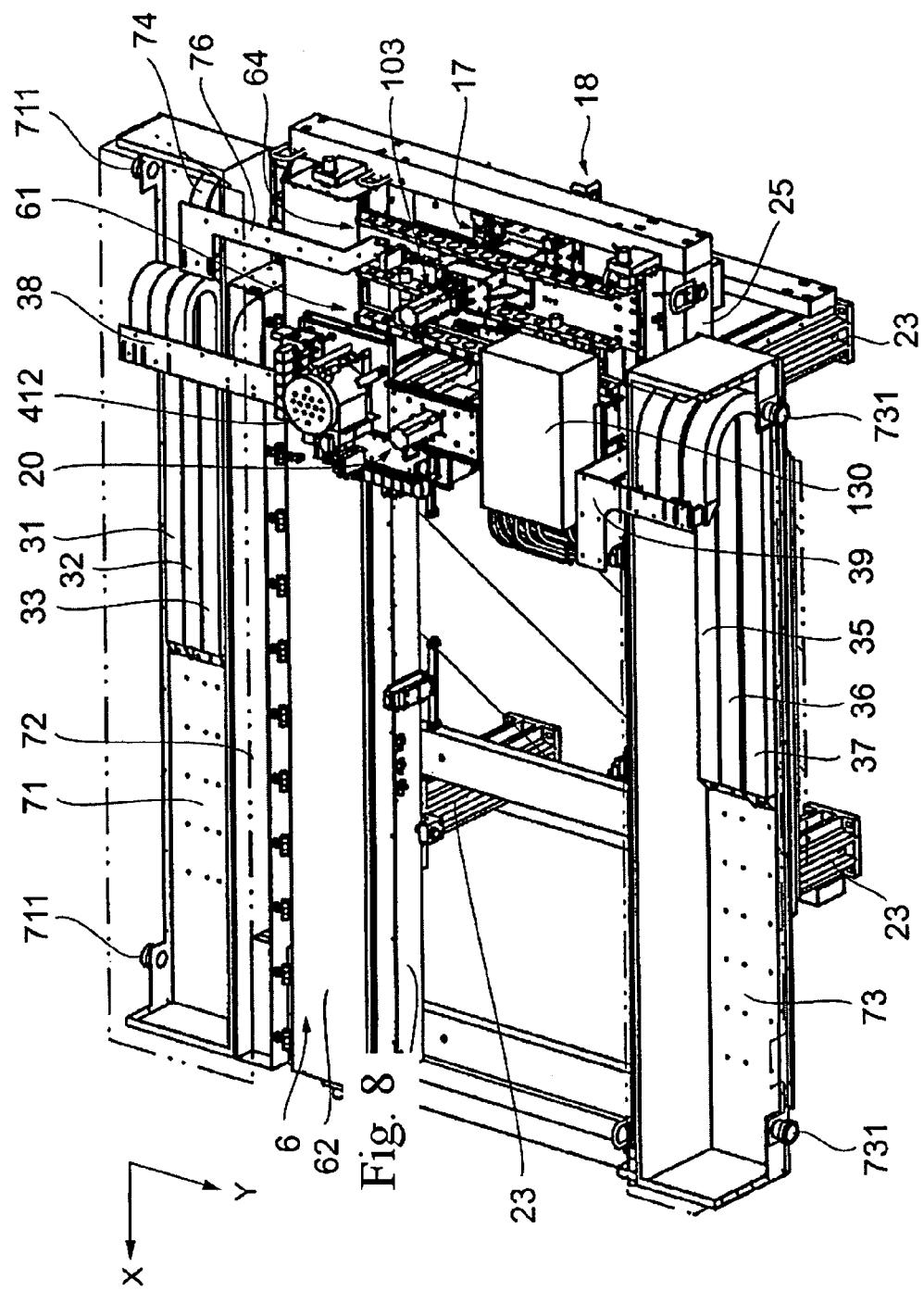
FIG. 8 is a perspective view showing the state where the cover portions of the housing portions of elongated member supporting and guiding apparatuses are removed from the state shown in FIG. 6.
Figure 9:
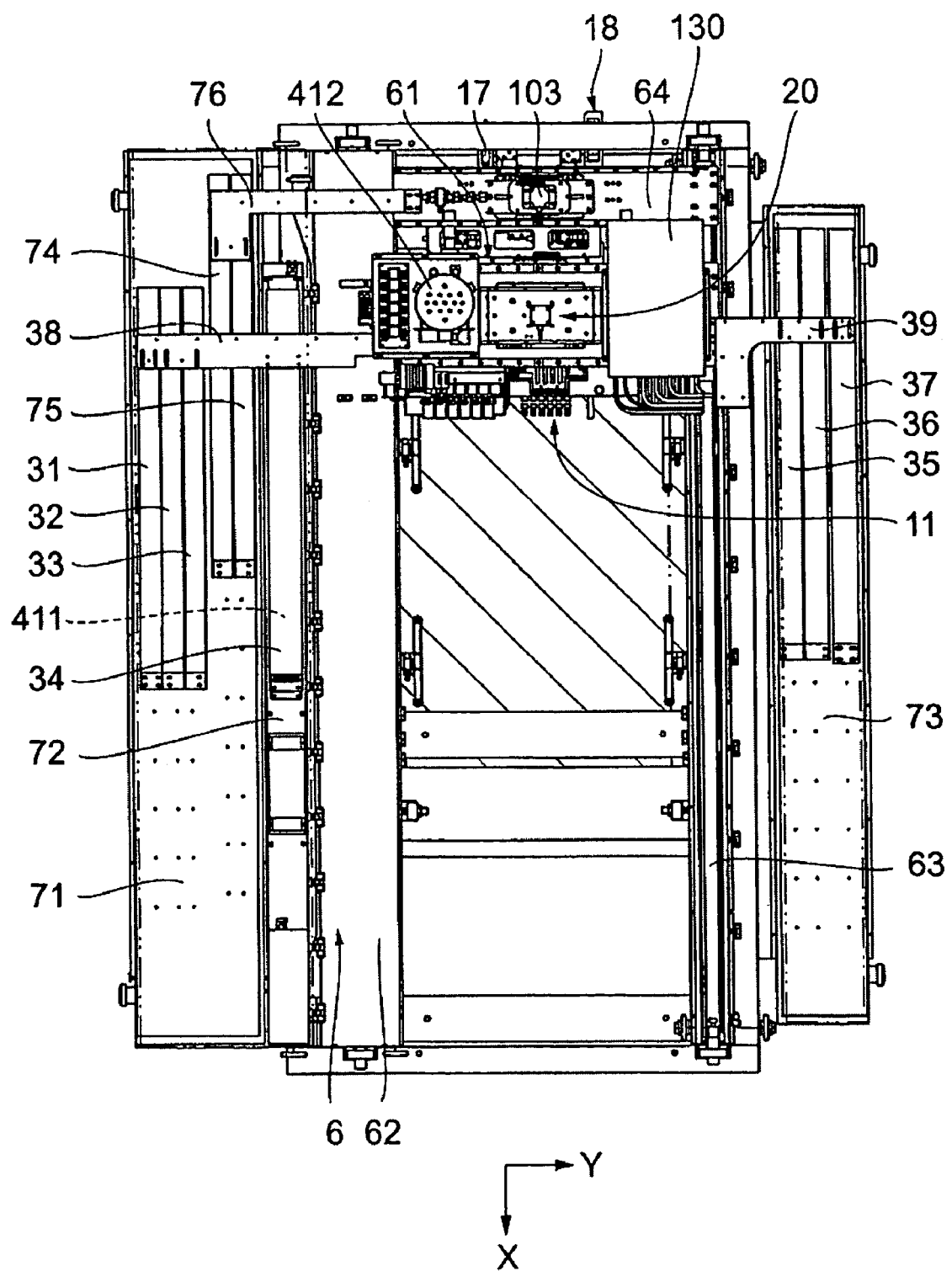
FIG. 9 is a plan view showing the state where the cover portions of the housing portions of elongated member supporting and guiding apparatuses are removed from the state shown in FIG. 6.

FIG. 6 is a perspective view showing the head unit support and the X-axis direction moving mechanism and the like in the droplet jetting apparatus shown in FIGS. 1 and 2. FIG. 7 is a side view when viewed from the direction of the arrow A in FIG. 6. FIG. 8 is a perspective view showing the state where the cover portions of the housing portions of elongated member supporting and guiding apparatuses are removed from the state shown in FIG. 6. FIG. 9 is a plan view showing the state where the cover portions of the housing portions of elongated member supporting and guiding apparatuses are removed from the state shown in FIG. 6.

As shown in FIGS. 6 and 7, four columns 23 separated into two pairs on both sides of the Y-axis direction moving mechanism 5, and two mutually parallel girders (beams) 24 and 25 which extend along the X-axis direction supported by means of the columns 23 are provided on the top of the stone machine platen 22 (i.e., the column supports 222 and 223). The substrate conveying table 3 is able to pass under the beams 24 and 25.

The X-axis direction moving mechanism 6 is supported on the four columns 23 via the beams 24 and 25. As shown in FIGS. 6 and 9, the X-axis direction moving mechanism 6 includes the head unit support 61 for supporting the head unit 11, a position detecting means support 64 for supporting the alignment camera 17 and the drawing confirmation camera 18, a linear motor actuator 62 provided on the top of the beam 24, and a guide 63 which guides the head unit support 61 and the position detecting means support 64 in the X-axis direction provided on the top of the beams 25. The head unit support 61 and the position detecting means support 64 are mounted between the linear motor actuator 62 and the guide 63.

The linear motor actuator 62 is equipped with a guide which guides the head unit support 61 and the position detecting means support 64 in the X-axis direction, and a linear motor which moves the head unit support 61 and the position detecting means support 64 in the X-axis direction. The linear motor of the linear motor actuator 62 has two movable portions (not shown in the drawings) on the same axis, and these movable portions can be moved independently. Further, the movable portion positioned in the lower side in FIG. 9 of the two movable portions is connected to the head unit support 61, and the movable portion positioned in the upper side in FIG. 9 is connected to the position detecting means support 64. By forming this kind of structure, the X-axis direction moving mechanism 6 can support the head unit support 61 and the position detecting means support 64 coaxially, and can move these independently from each other in the X-axis direction.

In this way, in the present embodiment, the X-axis direction moving mechanism 6 is constructed from a head unit moving mechanism for moving the head unit 11 in the X-axis direction, and a position detecting means moving mechanism for moving the alignment camera 17 (i.e., position detecting means) in the X-axis direction independently from the head unit 11. However, the present invention is not limited to this structure, and it is possible for the head unit moving mechanism and the position detecting means moving mechanism to be constructed on separate axes. Further, the driving source is not limited to a linear motor, and other structures may be used, such as a structure in which two ball screws are used, or a structure in which the shaft of a ball screw is fixed with two movable portions coaxially provided on this shaft, for example.

The head unit 11 is removably supported on the head unit support 61 via a head unit height adjusting mechanism 20 (see FIG. 7). In this way, it is possible to adjust the distance between the nozzle forming surfaces of the droplet jetting heads 111 and the substrate W in accordance with the thickness of the substrate W.

As shown in FIG. 6, the linear motor actuator 62 and the guide 63 are provided to extend over the columns 23 to the outside (i.e., the side of an auxiliary apparatus 12, see FIG. 1). In this way, it becomes possible to move the head unit support 61 and the head unit 11 above the auxiliary apparatus 12 (described later).

Now, in this kind of droplet jetting apparatus 1 of the present invention, as shown in FIGS. 5–8, the head driving control section 130 is provided on the head unit support 61, and is constructed to move in the X-axis direction together with the head unit 11. As shown in FIG. 7, the head driving control section 130 and each of the droplet jetting heads 111 are connected via shielded wires 140 that serve as second transmission means.

The head driving control section 130 includes a head driver, a power amplifier, a buffer circuit and the like (not shown in the drawings). The head driving control section 130 controls the driving of each droplet jetting head 111 by drawing pattern data transmitted from the control unit 16 to each droplet jetting head 111 via the shielded wires 140. In this regard, in the present invention, the second transmission means that connect the head driving control section 130 to each of the droplet jetting heads 111 is not limited to shielded wires, and may be constructed by other kinds of electric cables, optical fibers or the like.

By forming this kind of structure, in the present invention, because the head driving control section 130 is provided near the head unit 11 and moves together with the head unit 11, the length of the shielded wires 140 (second transmission means) that connect the head driving control section 130 to each of the droplet jetting heads 111 can be made as short as possible. As a result, it is possible to suppress the generation of noise (for example, cross talk and the like) in the process of transmitting drawing pattern data to each of the droplet jetting heads 111 from the head driving control section 130, and this makes it possible to prevent the occurrence of jetting time lags or jetting misses or the like due to such noise. Accordingly, because it is possible to accurately control the driving of the droplet jetting heads 111, it is possible to draw patterns on the substrate W at high accuracy.

Next, a description will be given for the supply route of the jetting object liquid to the head unit 11 (droplet jetting heads 111).

As shown in FIGS. 6 and 7, a secondary tank 412 is provided in the head unit support 61. The pressure inside the secondary tank 412 is regulated by a negative pressure control unit (not shown in the drawings). The jetting object liquid tank (primary tank) provided in the tank placing portion 13 is connected to the secondary tank 412 via a liquid supplying pipeline 411 constructed from flexible tubes, and the jetting object liquid is supplied through this liquid supplying pipeline 411. This liquid supplying pipeline may have just one pipe or the same number (i.e., twelve) of pipes as the number of droplet jetting heads 111. Further, the secondary tank 412 is constructed to the head unit 11 via a pipeline (not shown in the drawings) having the same number (i.e., twelve) of pipes as the number of droplet jetting heads 111, and the jetting object liquid is supplied to each of the droplet jetting heads 111 through this pipeline.

Next, a description will be given for the elongated member arrangement structure provided between the main body 2 (base portion) and the head unit support 61 (moving portion).

Various flexible elongated members (liquid supplying pipelines, ventilation pipelines, and electric wirings) are arranged between the main body 2 and the head unit support 61. These elongated members are respectively housed in elongated member supporting and guiding apparatuses, and are guided so as to follow the movement of the head unit support 61 in the X-axis direction. In this regard, the elongated member supporting and guiding apparatuses are generally called "cableveyor", and are long, thin casings which are connected so that adjacent units of a plurality of single units can pivot (move) with respect to each other.

As shown in FIGS. 8 and 9, a total of seven elongated member supporting and guiding apparatuses 31–37 are provided for the head unit support 61. Among these apparatuses, the elongated member supporting and guiding apparatuses 31–34 are positioned at the left side (i.e., the side of the secondary tank 412) with respect to the head unit support 61 in FIG. 9. One ends of these elongated member supporting and guiding apparatuses 31–34 are fixed to the head unit support 61. via a connecting member 38, and the other ends of the elongated member supporting and guiding apparatuses 31–34 are fixed to the side of the main body 2.

Further, the elongated member supporting and guiding apparatuses 35–37 are positioned at the right side (i.e., the side of the head driving control section 130) with respect to the head unit support 61 in FIG. 9. One ends of these elongated member supporting and guiding apparatuses 35–37 are fixed to the head unit support 61 via a connecting member 39, and the other ends of the elongated member supporting and guiding apparatuses 35–37 are fixed to the side of the main body 2.

Wiring for driving a θ-axis motor, wiring for a light source of a head position correcting camera, wiring for driving the motor of the head unit height adjusting mechanism 20 and the like are housed as electric wiring for strong electricity (i.e., wiring for dealing with a relatively high current/voltage level) in the elongated member supporting and guiding apparatus 31.

Wiring for a θ linear encoder, wiring for a CCD camera of the head position correcting camera, wiring for a sensor of the head unit height adjusting mechanism 20, wiring for a θ sensor and the like are housed as electric wiring for weak electricity (i.e., wiring for dealing with a relatively low current/voltage level) in the elongated member supporting and guiding apparatus 32.

A pipeline for θ-axis motor exhaust, a pipeline for exhaust of the head unit height adjusting mechanism 20, and a ventilation pipelines of a manifold valve and the like are housed in the elongated member supporting and guiding apparatus 33.

The liquid supplying pipeline 411 described above for supplying the jetting object liquid to the droplet jetting heads 111 is housed in the elongated member supporting and guiding apparatus 34.

Electro-optical wiring (a 5V DC cable, a 42V DC cable, a GND cable, optical fibers, a thermostat signal wire and the like) for input to the head driving control section 130 and electric wiring (a 5V DC cable, a signal cable and the like) for output therefrom are respectively housed in the elongated member supporting and guiding apparatuses 35 and 36. The optical fibers of the input electro-optical wiring described above function as first transmission means which connect the control unit 16 to the head driving control section 130, and the drawing pattern data is transmitted from the control unit 16 to the head driving control section 130 via these optical fibers (i.e., first transmission means). However, the first transmission means is not limited to optical fibers, and may be constructed from an electric cable.

A ventilation pipeline is housed in the elongated member supporting and guiding apparatus 37.

In this way, in the elongated member arrangement structure for the head unit support 61, the liquid supplying pipeline 411, the electric wiring and the ventilation pipeline are housed inside separate elongated member supporting and guiding apparatuses. Therefore, even in the case where for some reason the jetting object liquid leaks out from a crack or the like formed in the liquid supplying pipeline 411 due to aging deterioration, it is possible to prevent damage (such as corrosion and the like) to the electric wiring and the ventilation pipeline.

Further, by housing the electric wiring for strong electricity and the electric wiring for weak electricity in separate elongated member supporting and guiding apparatuses, it is possible to prevent the generation of noise caused by interference between both two types of electric wiring, and this makes it possible to avoid the adverse effects of noise.

As shown in FIGS. 8 and 9, three housing portions 71–73 for housing the elongated member supporting and guiding apparatuses are provided in the main body 2. The housing portions 71–73 are formed so that each of the housing portions 71–73 has a box shape. In this case, the constituent material of the housing portions 71–73 is not particularly limited, but stainless steel is preferred in consideration of corrosion resistance of the material.

Among these housing portions 71–73, the housing portions 71 and 72 are positioned outside from the linear motor actuator 62. Further, the elongated member supporting and guiding apparatuses 31–33 are housed in the housing portion 71, and the elongated member supporting and guiding apparatus 34 is housed in the housing portion 72. Moreover, the housing portion 73 is positioned outside from the guide 63, and the elongated member supporting and guiding apparatuses 35–37 are housed therein.

In this way, in the present invention, the elongated member supporting and guiding apparatus 34 that houses the liquid supplying pipeline 411 and the elongated member supporting and guiding apparatuses 31–33 and 35–37 that respectively house the electric wiring and the ventilation pipeline are housed in separate housing portions. Therefore, even in the case where for some reason the jetting object liquid leaks out from the liquid supplying pipeline 411, because it is possible to keep the leaked jetting object liquid inside the housing portion 72 and prevent the spread thereof to the surroundings, it becomes possible to more reliably prevent the jetting object liquid from coming into contact with the electric wiring and ventilation pipeline housed in the other elongated member supporting and guiding apparatuses 31–33 and 35–37.

Further, the elongated member arrangement structure of the present embodiment is equipped with suction discharging means which carry out suction and discharge from the housing portions 71–73. First, a description will be given for the suction discharging means of the housing portions 71, 73.

As shown in FIGS. 8 and 9, suction holes 711, 731 are respectively provided in the housing portions 71, 73, and suction pipelines (not shown in the drawings) which lead to a suction pump provided outside the chamber 91 are connected to these suction holes 711, 731. In this way, because the dust and the like generated from the elongated member supporting and guiding apparatuses housed in the housing portions 71, 73 can be sucked up and discharged to the outside, it is possible to maintain a high cleanness level inside the chamber 91, and this makes it possible to form (draw) patterns on the substrate W in an optimum manner. Further, as shown in FIGS. 6 and 7, because the housing portions 71, 73 respectively include cover portions 712, 732 which cover the upper side of the housed elongated member supporting and guiding apparatuses, it is possible to suck up and discharge the dust and the like to the outside while more reliably preventing dispersion of the dust and the like to the surroundings.

Figure 13:
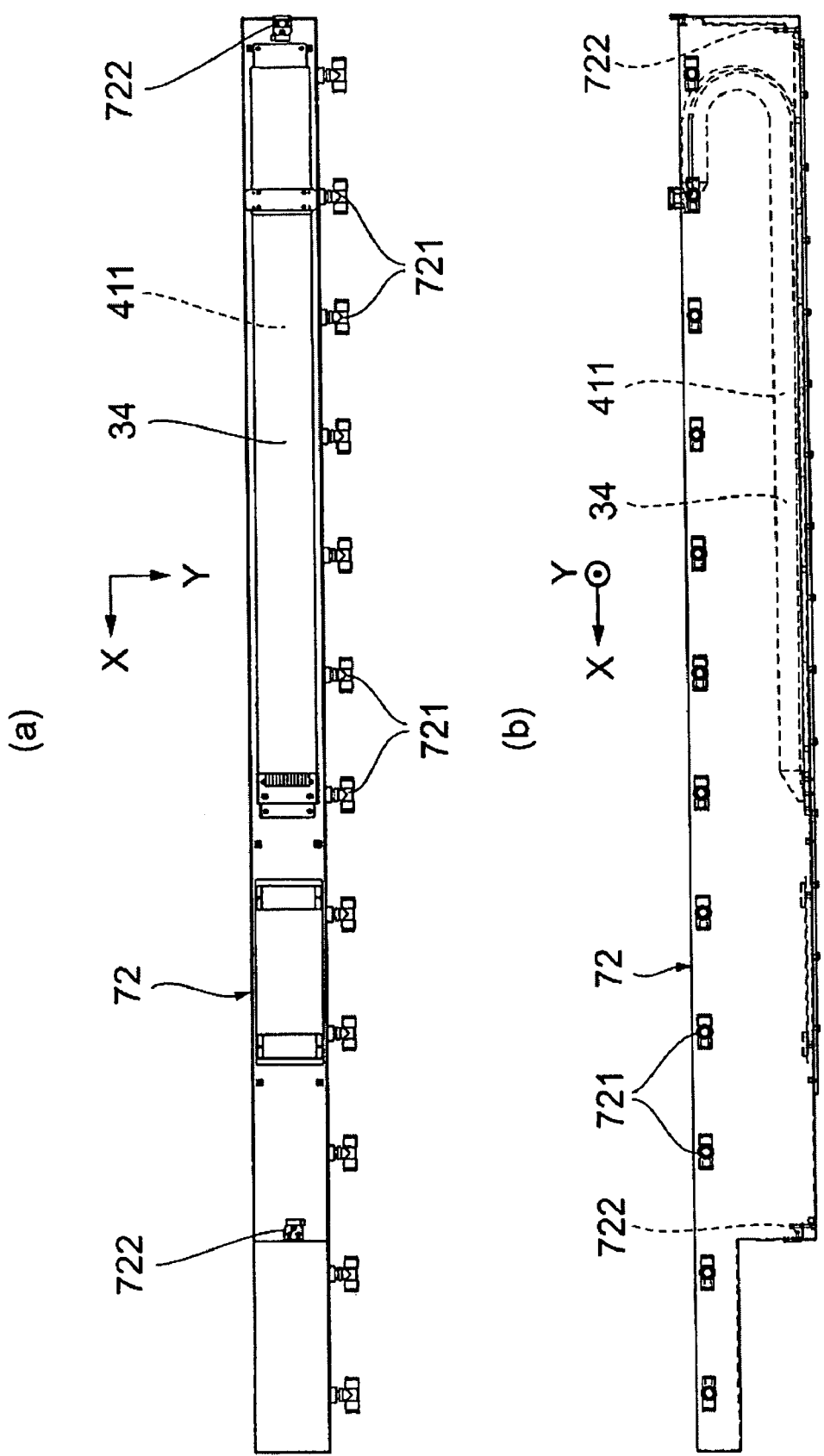
FIGS. 13(a) and 13(b) are respectively a plan view and a side view showing the elongated member supporting and guiding apparatus and the housing portion.

Next, a description will be given for the suction discharging means of the housing portion 72. FIGS. 13(*a*) and 13(*b*) are respectively a plan view and a side view showing the elongated member supporting and guiding apparatus 34 and the housing portion 72. As shown in FIG. 13, a plurality of suction holes 721 (twelve holes are shown in the drawings) are provided in the housing portion 72 along the longitudinal direction thereof, and each of these suction holes 721 are connected to a suction pipeline (not shown in the drawings) which leads to a suction pump provided outside the chamber 91. Therefore, because the dust and the like generated from the elongated member supporting and guiding apparatus 34 and organic outgas generated from the suction pipeline 411 through which the jetting object liquid passes can be sucked up and discharged to the outside, it is possible to maintain a high cleanness level inside the chamber 91, and it is possible to prevent hazards due to such outgas.

Further, in the present embodiment, liquid leak sensors 722 for detecting the presence of liquid are provided in the bottom of the housing portion 72. Thus, when for some reason the jetting object liquid leaks out from the liquid supplying pipeline 411 and collects in the bottom of the housing portion 72, because this can be detected, it is possible to quickly deal with such problem, and this makes it possible to prevent serious damage.

The detection signals of the liquid leak sensors 722 are inputted into the control unit 16. When the liquid leak sensors 722 detect liquid, the control unit 16 reports (informs of) such fact to prompt the operator to deal with the problem. As for the method of such reporting, it is possible to use a method in which characters or figures are displayed on the operation panel of the control unit 16, or a method in which sound or voice is outputted.

Further, in the structure shown in the drawings, because the liquid leak sensors 722 are respectively provided near both ends of the housing portion 72, it is possible to quickly detect liquid leaks no matter which side the housing portion 72 leans to.

All or a part of the inner surfaces (especially, the side surfaces) of the housing portions 71–73 are preferably covered by a resin (for example, a fluoric resin or the like such as Teflon (PTFE) (here, Teflon is a registered trademark) or the like). Thus, it is possible to prevent the generation of dust even in the case where for some reason the leaked liquid comes into contact with the inner surfaces of the housing portions when the elongated member supporting and guiding apparatuses are moved. The process of covering the surfaces with the resin can be carried out by applying an adhesive tape made of resin, for example.

Next, a description will be given for the alignment camera 17, the drawing confirmation camera 18 and a camera height adjusting mechanism 103.

As shown in FIG. 6, the alignment camera 17 and the drawing confirmation camera 18 are supported on the position detecting means support 64 via the camera height adjusting mechanism 103.

Figure 10:
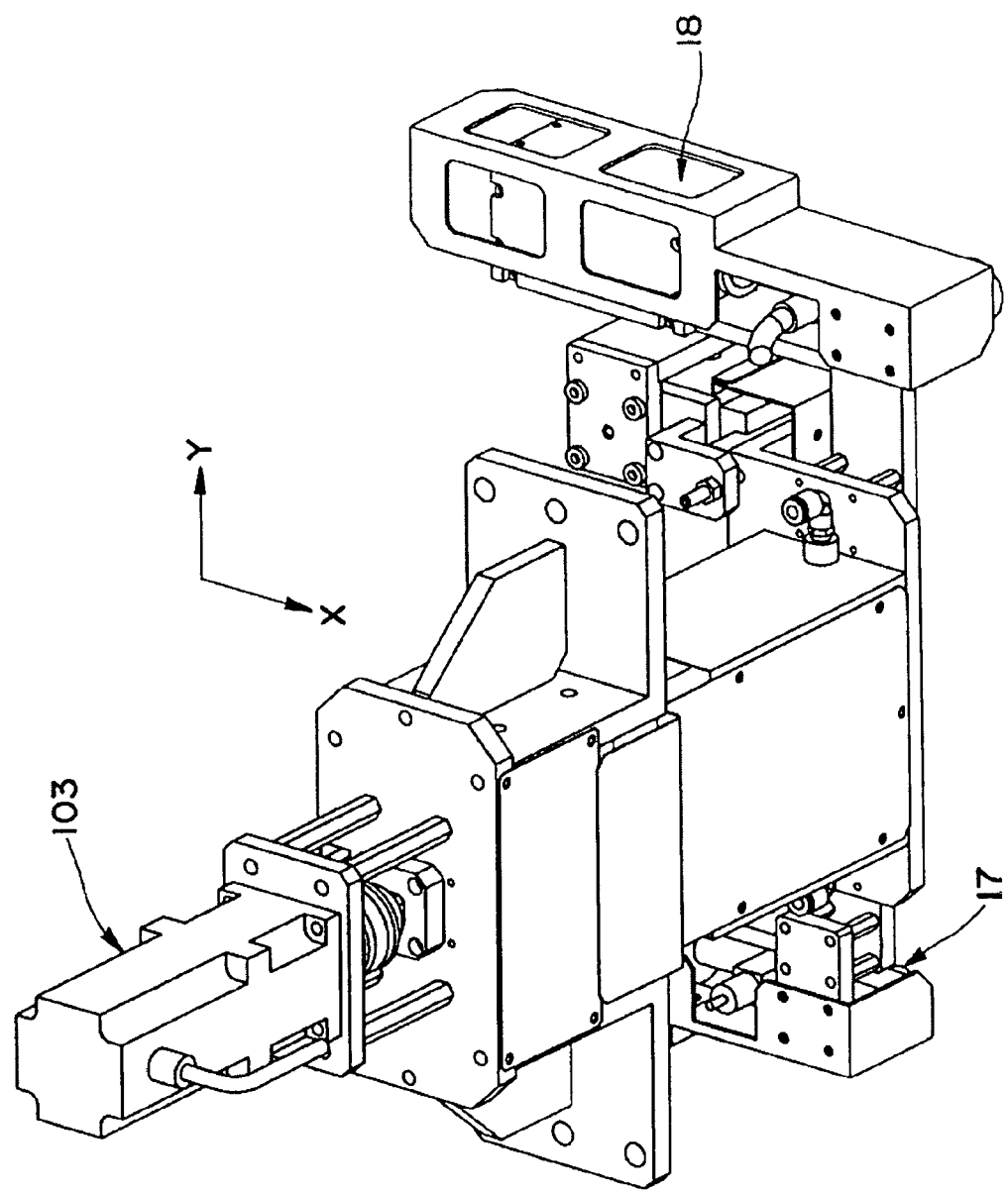
FIG. 10 is a perspective view showing the alignment camera, the drawing confirmation camera and the camera height adjusting mechanism.
Figure 11:
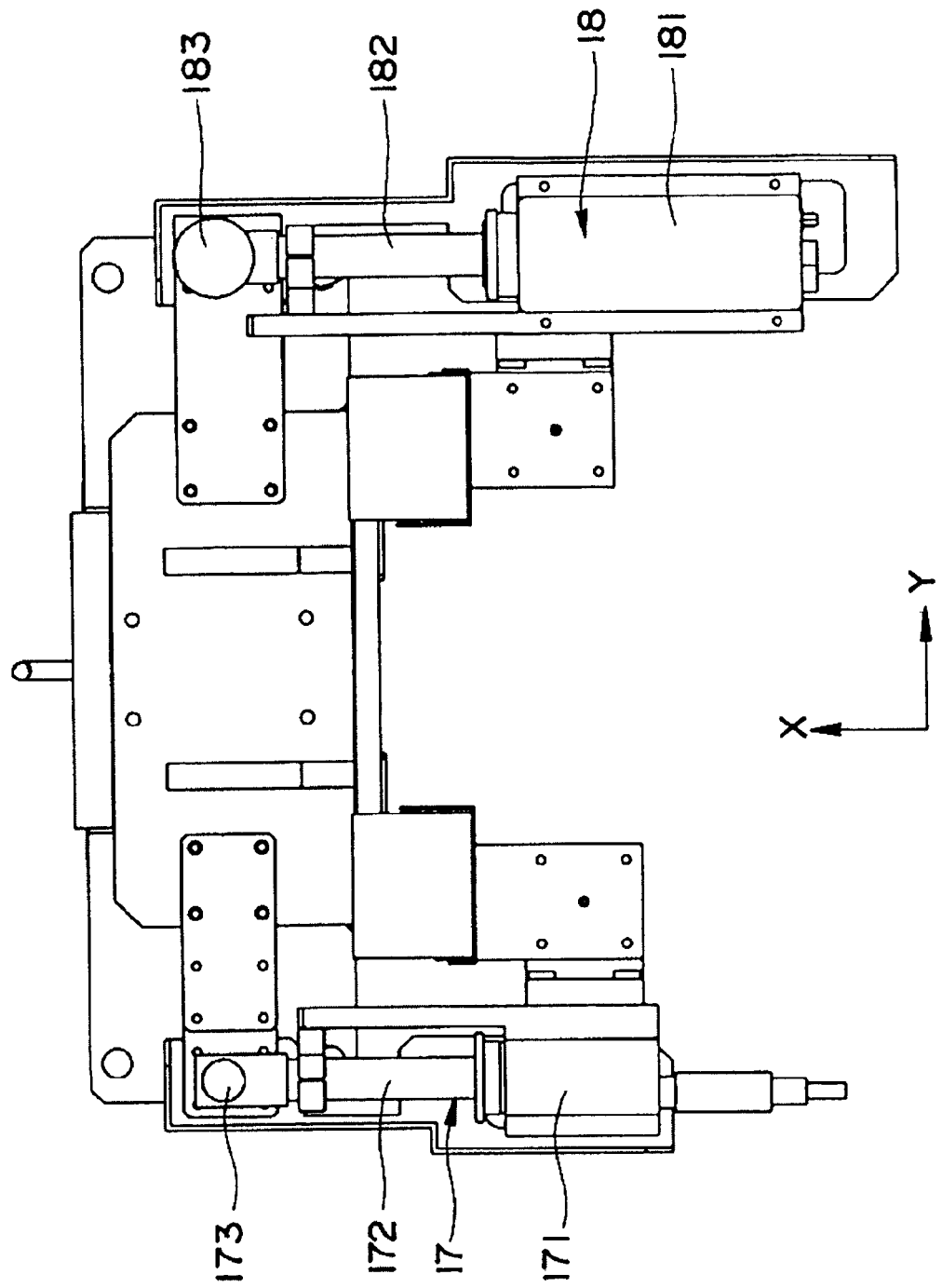
FIG. 11 is a bottom view showing the alignment camera, the drawing confirmation camera and the camera height adjusting mechanism.

FIG. 10 is a perspective view showing the alignment camera 17, the drawing confirmation camera 18 and the camera height adjusting mechanism 103. FIG. 11 is a bottom view showing the alignment camera 17, the drawing confirmation camera 18 and the camera height adjusting mechanism 103.

As shown in FIG. 11, the alignment camera 17 is equipped with a camera body 171 which includes an imaging element such as a CCD or the like, for example, a lens mirror tube 172, and a prism 173 which refracts the optical axis downward. The alignment camera 17 functions as position detecting means that carries out image recognition to detect the position(s) of one or a plurality of alignment marks (indicators) set at predetermined positions of the substrate W placed and positioned (pre-aligned) on the substrate conveying table 3.

In this regard, in the present invention, the position detecting means is not limited to one carrying out the optical detection of indicators like the alignment camera 17, and may use any other means. Further, the portions forming the indicators of the substrate W are not limited to alignment marks, and the detecting operation may be carried out with edge portions of the substrate W serving as indicators. Moreover, a plurality of alignment cameras 17 may be provided in the position detecting means support 64.

The drawing confirmation camera 18 is equipped with a camera body 181 which includes an imaging element such as a CCD or the like, for example, a lens mirror tube 182, and a prism 183 which refracts the optical axis downward. The drawing confirmation camera 18 confirms the drawing state (droplet impact state) of the patterns formed (drawn) on the substrate W. After a pattern is formed (drawn) on the substrate W, it is possible to easily and quickly confirm the drawing state for the substrate W by optically detecting (imaging) the surface of the substrate W with the drawing confirmation camera 18 while the substrate W and the drawing confirmation camera 18 are moved in a relative manner in the X-axis direction and the Y-axis direction, respectively.

The camera height adjusting mechanism 103 shown in FIG. 10 can adjust the height of the alignment camera 17 and the drawing confirmation camera 18 by means of a ball screw and a servomotor (pulse motor). In this way, the focal points of the alignment camera 17 and the drawing confirmation camera 18 can be made to match substrates W each having different thickness.

A description will now be given for the alignment of the substrate W in the droplet jetting apparatus 1. After a substrate W is supplied (loaded) on the substrate conveying table 3 by an operator, a substrate positioning apparatus (description thereof is omitted) provided in the droplet jetting apparatus 1 is operated, whereby the substrate W is positioned (pre-aligned) at a predetermined position on the substrate conveying table 3. In this regard, this pre-alignment operation may be carried out by an industrial robot that supplies and positions the substrate W with a required accuracy.

After alignment of the substrate W has been carried out, air is sucked out from each suction hole 332 of the substrate conveying table 3 to fix the substrate W to the substrate conveying table 3 by suction. Then, the main alignment is carried out.

In the main alignment, the alignment camera 17 is moved in a relative manner near one or a plurality of alignment marks of the substrate W by operating the Y-axis direction moving mechanism 5 and the X-axis direction moving mechanism 6, and the position of each alignment mark is detected by the alignment camera 17. At this time, the position information of each alignment mark on the substrate W inputted in advance is stored in the memory 162 of the control unit 16, and the control unit 16 controls the driving of the Y-axis direction moving mechanism 5 and the X-axis direction moving mechanism 6 based on this position information.

In this way, in the droplet jetting apparatus 1, by movably providing the alignment camera 17, it is possible to move the substrate W and the alignment camera 17 in a relative manner, and this makes it possible to fit the entire region of the substrate W inside the field of view (detection region) of the alignment camera 17. Accordingly, because the droplet jetting apparatus 1 can carry out alignment on the substrate W no matter where the alignment marks are positioned so long as the position information thereof is inputted in advance, it is possible to easily deal with changes to the specification or type of the substrate W, whereby the general applicability is improved.

Further, even if the positions of the alignment marks of the substrate W are changed, there is no need to carry out operations such as moving the alignment camera and carrying out minute adjustments thereof, which is different from the case where the alignment camera is a fixed type camera. Thus, this makes it possible to reduce the number of process steps. Accordingly, the productivity of the substrate W is improved and the manufacturing cost is reduced.

Further, because it is possible to easily detect a plurality of alignment marks with one alignment camera 17 by moving the substrate W and the alignment camera 17 in a relative manner, the system is complete with just one alignment camera 17 for detecting a plurality of alignment marks. Accordingly, the structure of the droplet jetting apparatus 1 is simplified and the manufacturing cost is reduced. On the contrary, in the case where the alignment camera is a fixed type camera, a plurality of alignment cameras needs to be provided to detect a plurality of alignment marks.

Moreover, because the alignment camera 17 does not have to be positioned above the substrate W during the drawing operation, it is easy to secure a mounting space for the other units (for example, the ionizing unit 109, the blowing apparatus 14 and the like), and this makes it possible to form a simple arrangement. Furthermore, even in the case where the substrate W is supplied and removed by an industrial robot, such operations can be carried out easily without the need to consider interference with the alignment camera 17.

The control unit 16 recognizes the positions of the alignment marks by carrying out image processing to the images taken by the alignment camera 17. Then, based on such recognition results, the control unit 16 operates the θ-axis rotating mechanism 105 to correct the posture (i.e., the incline around the θ-axis) of the substrate W, and corrects the position of the substrate W based on the image data. Then, based on the results of the main alignment, the control unit 16 controls the operations of the droplet jetting heads 111, the Y-axis direction moving mechanism 5 and the X-axis direction moving mechanism 6 to form (draw) a predetermined pattern on the substrate W. In this way, in the droplet jetting apparatus 1, it is possible to form (draw) patterns at the correction position of the substrate W.

Next, a description will be given for the elongated member arrangement structure provided between the main body 2 (base portion) and the position detecting means support 64 (moving portion).

As shown in FIG. 9, two elongated member supporting and guiding apparatuses 74 and 75 are provided for the position detecting means support 64 in the left side in FIG. 9. One ends of the elongated member supporting and guiding apparatuses 74 and 75 are fixed to the position detecting means support 64 via a connecting member 76, and the other ends thereof are fixed to the side of the main body 2. Further, the elongated member supporting and guiding apparatuses 74 and 75 are housed in the housing portion 71 described above.

Wiring for driving the motor of the camera height adjusting mechanism 103, wiring for the light sources of the alignment camera 17 and the drawing confirmation camera 18, and the like are housed as electric wiring for strong electricity in the elongated member supporting and guiding apparatus 74.

Wiring for the sensor of the camera height adjusting mechanism 103, wiring for CCD cameras of the alignment camera 17 and the drawing confirmation camera 18, and the like are housed as electric wiring for weak electricity in the elongated member supporting and guiding apparatus 75.

Further, exhaust pipeline of the camera height adjusting mechanism 103 and ventilation pipeline of an air pressure cylinder driving pipeline of the substrate positioning apparatus, and the like are also housed in the elongated member supporting and guiding apparatuses 74 and 75.

In this way, in the elongated member arrangement structure for the position detecting means support 64, by housing the electric wiring for strong electricity and the electric wiring for weak electricity in separate elongated member supporting and guiding apparatuses, it is possible to prevent the generation of noise caused by interference between both two types of electric wiring, and this makes it possible to avoid the adverse effects of noise.

Figure 14:
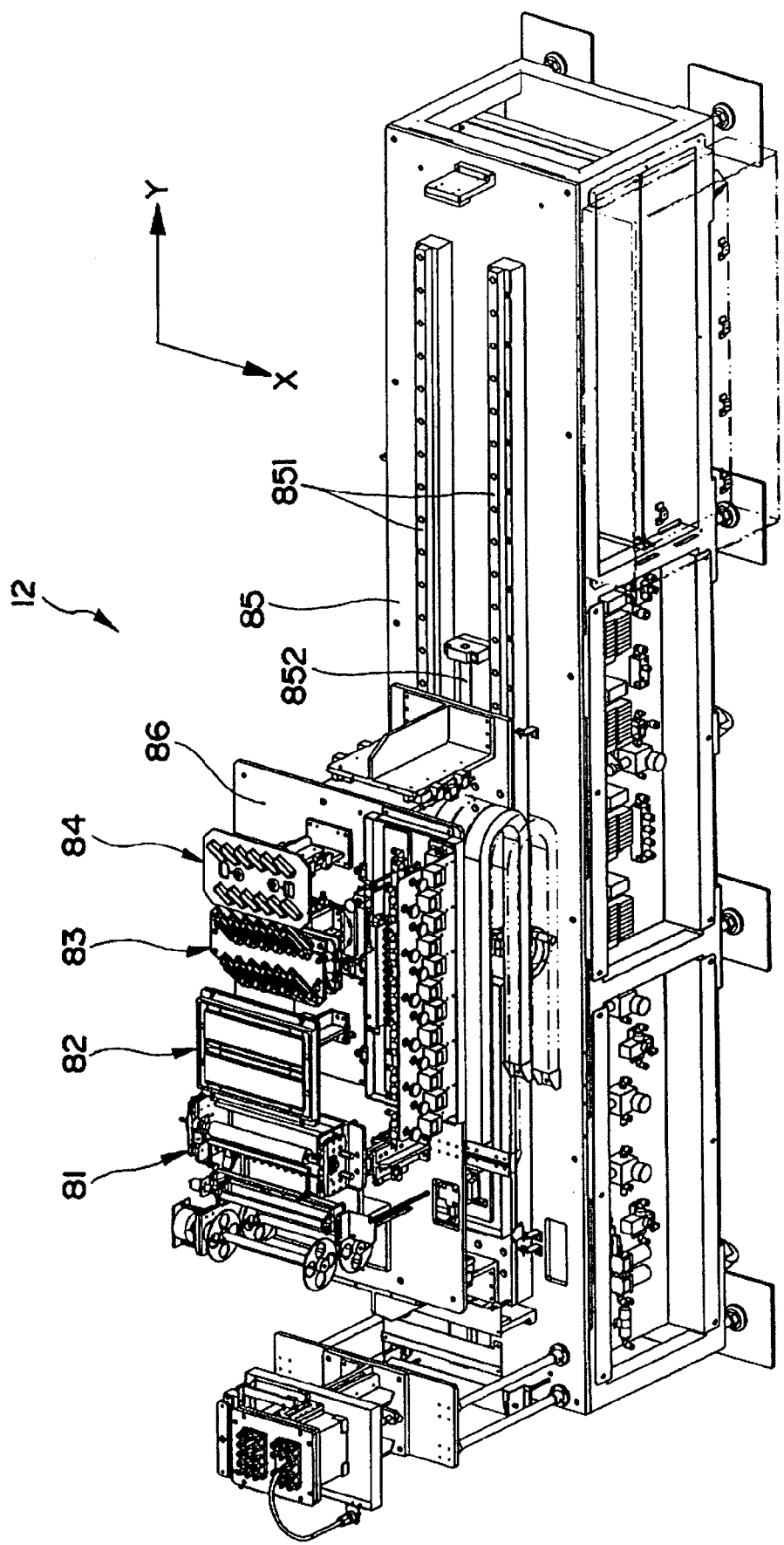
FIG. 14 is a perspective view showing an auxiliary apparatus in the droplet jetting apparatus shown in FIGS. 1 and 2.

FIG. 14 is a perspective view showing an auxiliary apparatus in the droplet jetting apparatus shown in FIGS. 1 and 2.

The auxiliary apparatus 12 is provided on the side of the trestle 21 and the stone machine platen 22 of the main body 2 (i.e., the front side in the X-axis direction with respect to the main body 2). As shown in FIG. 14, the auxiliary apparatus 12 includes a cleaning unit (wiping unit) 81, a periodic flushing unit 82, a capping unit 83, and a jetting mass measuring unit (weight measuring unit) 84.

The head unit 11 stands by at a position above the auxiliary apparatus 12 when the substrate W is supplied or removed, for example. Further, the nozzle forming surface of each droplet jetting head 111 undergoes cleaning, capping and periodic discard jetting (periodic flushing) during this standby. Hereinafter, each unit provided in the auxiliary apparatus 12 will be described in order.

The cleaning unit 81 operates by moving a wiping sheet that includes a cleaning liquid by means of a roller so that the nozzle forming surface of each droplet jetting head 111 is wiped by the wiping sheet. By wiping off the jetting object liquid sticking to the nozzle forming surfaces of the droplet jetting heads 111 by means of the cleaning unit 81, it is possible to prevent blockage (disturbance) to the droplet jetting direction (flying direction) from each jetting nozzle, whereby the droplets can fly straight. Therefore, it is possible to form (draw) patterns on the substrate W while maintaining high accuracy.

The periodic flushing unit 82 includes a liquid receiving portion which receives the jetted liquid discharged by the droplet jetting heads 111, and is used for carrying out flushing operation when the head unit 11 is in a standby state. A suction tube (not shown in the drawings) is connected to the periodic flushing unit 82, and the jetting object liquid that is discharged by jetting is passed through the suction tube and collected inside a waste liquid tank provided in the tank placing portion 13.

The capping unit 83 includes a plurality of caps arranged so as to respectively correspond to the droplet jetting heads 111, and a hoisting mechanism which hoists these caps up and down. A suction tube (not shown in the drawings) is connected to each cap. The capping unit 83 can cover the nozzle forming surface of each droplet jetting head 111 with each cap, and can suck jetting object liquid from each jetting nozzle. By carrying out capping operation by means of this kind of capping unit 83, it is possible to prevent the nozzle forming surfaces of the droplet jetting heads 111 from drying out, and it is also possible to retrieve (resolve) nozzle clogs (blockage in the nozzle).

In addition to the standby time of the head unit 11, this capping operation may also be carried out when the head unit 11 is initially filled with the jetting object liquid, when the jetting object liquid is discharged from the head unit 11 in the case where replacement with a different kind of jetting object liquid is to be carried out, and when the flow route is washed with a cleaning liquid, and the like.

The jetting object liquid discharged from the droplet jetting heads 111 during the capping operation by the capping unit 83 passes through the suction tubes described above, and flows into and is stored inside a recycling tank provided in the tank placing portion 13. This stored liquid is collected and supplied for reuse. However, the collected cleaning liquid during the washing of the flow route is not reused.

The jetting mass measuring unit 84 is used to measure the one-time droplet jetting mass (weight) from the droplet jetting heads 111 as a preparatory step in the operation of jetting droplets on the substrate W. Namely, before jetting droplets on the substrate W, the head unit 11 moves above the jetting mass measuring unit 84, and droplets are jetted toward the jetting mass measuring unit 84 one time or a plurality of times from all the jetting nozzles of each droplet jetting head 111. The jetting mass measuring unit 84 is equipped with a removable liquid receiving portion which receives the jetted liquid, and the weight of the liquid received by this liquid receiving portion is measured by a weighing device such as an electronic scale or the like provided outside the droplet jetting system 10. Alternatively, a weighing device may be provided in the jetting mass measuring unit 84 to measure the weight of the received liquid. Based on such weight measurement results, the control unit 16 calculates the mass (weight) of one droplet jetted from the jetting nozzles, and the voltage applied to the head driver that drives the droplet jetting heads 111 is corrected to make this calculated value the same as a predetermined design value.

The auxiliary apparatus 12 is further equipped with an attachment platform 85 provided on the floor, and a moving platform 86 which is movable in the Y-axis direction on the attachment platform 85. The attachment platform 85 has a long shape in the Y-axis direction, and a pair of guides (rails) 851 for guiding the moving platform 86 in the Y-axis direction is provided on the top portion thereof. Further, a driving mechanism that includes a ball screw 852 is provided on the top portion of the attachment platform 85, and the moving platform 86 is driven by this driving mechanism to move in the Y-axis direction along the guides 851.

The cleaning unit 81, the periodic flushing unit 82, the capping unit 83 and the jetting mass measuring unit 84 are arranged in a line in the Y-axis direction on the moving platform 86 described above. Further, by moving the moving platform 86 in the Y-axis direction with the head unit 11 in a state positioned above the auxiliary apparatus 12, it is possible to position any one of the cleaning unit 81, the period flushing unit 82, the capping unit 83 and the jetting mass measuring unit 84 below the head unit 11. In this way, the head unit 11 can selectively carry out any of the above-described nozzle forming surface cleaning, periodic flushing, capping and jetting of droplets to the jetting mass measuring unit 84.

As described above, the droplet jetting apparatus of the present invention was explained for the embodiments shown in the drawings, but the present invention is not limited to these embodiments. Further, each portion forming the droplet jetting apparatus can be replaced with any element capable of performing the same or a similar function. Moreover, any element may be added to the droplet jetting apparatus of the present invention.

Further, instead of using a linear motor, the Y-axis direction moving mechanism and the X-axis direction moving mechanism may use a ball screw (feed screw) or the like, for example.

Moreover, the droplet jetting apparatus of the present invention may be constructed so that the work (work placing portion) is fixed with respect to the main body, and the head unit (droplet jetting heads) is moved in the Y-axis direction and the X-axis direction to carry out the main scan and the sub scan operations.

Further, an electro-optical apparatus of the present invention is characterized as being manufactured using the droplet jetting apparatus of the present invention as described above. The electro-optical apparatus of the present invention is not limited to any specific examples. For example, a liquid crystal display device, an organic EL display device or the like may be mentioned.

Moreover, a method of manufacturing an electro-optical apparatus of the present invention is characterized as using the droplet jetting apparatus of the present invention. The method of manufacturing the electro-optical apparatus of the present invention can be applied to a method of manufacturing a liquid crystal display device, for example. Namely, by selectively jetting a liquid that includes a filter material of each color onto a substrate using the droplet jetting apparatus of the present invention, it is possible to manufacture a color filter in which a plurality of filter elements are arranged on the substrate, and then this color filter can be used to manufacture a liquid crystal display device. In addition to this example, the method of manufacturing the electro-optical apparatus of the present invention can be applied to a method of manufacturing an organic EL display device, for example. Namely, by selectively jetting a liquid that includes a light-emitting material of each color onto a substrate using the droplet jetting apparatus of the present invention, it is possible to manufacture an organic EL display device in which a plurality of picture element pixels that include an EL layer are arranged on the substrate.

Furthermore, an electronic device of the present invention is characterized as being equipped with an electro-optical apparatus manufactured as described above. The electronic device of the present invention is not limited to any specific examples. A personal computer or portable telephone (mobile phone) or the like equipped with a liquid crystal display device or an organic EL display device manufactured as described above may be mentioned.

INDUSTRIAL APPLICABILITY

According to the present invention, it is possible to provide a droplet jetting apparatus capable of suppressing the generation of noise in the drawing pattern data transmission, and carrying out accurate driving of the droplet jetting heads; an electro-optical apparatus which is manufactured using such droplet jetting apparatus; a method of manufacturing an electro-optical apparatus using such droplet jetting apparatus; and an electronic device equipped with such electro-optical apparatus. Accordingly, the present invention has wide industrial applicability.

The invention claimed is:

1. A droplet jetting apparatus comprising:
   a main body;
   a work placing portion on which a work is to be placed;
   a head unit having at least one droplet jetting head for jetting droplets of a liquid to be used onto the work;
   a head unit support for supporting the head unit, the head unit support being movably provided with respect to the main body in a horizontal direction;
   a head unit moving mechanism for moving the head unit support in the horizontal direction with respect to the main body;
   a head driving control section for controlling driving of the at least one droplet jetting head, the head driving control section being provided on the head unit support so that the head driving control section can be moved in a horizontal direction with respect to the main body together with the head unit support by the head unit moving mechanism;
   a control unit for controlling the head driving control section, the control unit storing drawing pattern data including a plurality of patterns;
   first transmission means which connects the control unit to the head driving control section for transmitting the drawing pattern data from the control unit to the head driving control section; and
   second transmission means which connects the head driving control section to the at least one droplet jetting head of the head unit for transmitting the drawing pattern data from the head driving control section to the at least one droplet jetting head;
   wherein the droplet jetting apparatus is constructed so as to form a predetermined pattern in the plurality of patterns onto the work by jetting droplets to the work from the at least one droplet jetting head while moving the work placing portion and the head unit relatively to each other;
   characterized in that the head unit is supported on the head unit support via a distance adjusting mechanism provided between the head unit support and the head unit for adjusting a height of the head unit with respect to the head unit support.

2. The droplet jetting apparatus as claimed in claim 1, further comprising a Y-axis direction moving mechanism for moving the work placing portion in a Y-axis direction, the Y-axis direction being a horizontal direction with respect to the main body, and wherein the head unit moving mechanism moves the head unit support in an X-axis direction, the X-axis direction being another horizontal direction perpendicular to the Y-axis direction.

3. The droplet jetting apparatus as claimed in claim 2, wherein one of the X-axis and Y-axis directions is defined as a main scan direction and the other is defined as a sub scan direction, and wherein the droplet jetting apparatus is constructed so as to form the predetermined pattern onto the work by moving the work placing portion and the head unit relatively.

* * * * *